United States Patent
Kim et al.

(10) Patent No.: US 7,394,116 B2
(45) Date of Patent: Jul. 1, 2008

(54) SEMICONDUCTOR DEVICE INCLUDING A MULTI-CHANNEL FIN FIELD EFFECT TRANSISTOR INCLUDING PROTRUDING ACTIVE PORTIONS AND METHOD OF FABRICATING THE SAME

(75) Inventors: Sungmin Kim, Yongin (KR); Donggun Park, Sungnam (KR); Eunjung Yoon, Seoul (KR); Semyeong Jang, Anyang (KR); Keunnam Kim, Seoul (KR); Yongchul Oh, Suwon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 210 days.

(21) Appl. No.: 11/033,526

(22) Filed: Jan. 12, 2005

(65) Prior Publication Data
US 2005/0285204 A1   Dec. 29, 2005

(30) Foreign Application Priority Data
Jun. 28, 2004   (KR) ...................... 10-2004-0049003

(51) Int. Cl.
H01L 29/76 (2006.01)
H01L 29/745 (2006.01)
(52) U.S. Cl. .................. 257/213; 257/E21.4; 257/347; 257/354; 257/401
(58) Field of Classification Search ................. 257/347, 257/354, 213, 401
See application file for complete search history.

(56) References Cited

U.S. PATENT DOCUMENTS

| | | | | |
|---|---|---|---|---|
| 5,495,439 A | * | 2/1996 | Morihara | 365/149 |
| 6,391,782 B1 | | 5/2002 | Yu | 438/696 |
| 6,413,802 B1 | | 7/2002 | Hu et al. | 438/151 |
| 6,664,582 B2 | | 12/2003 | Fried et al. | 257/308 |
| 6,762,477 B2 | * | 7/2004 | Kunikiyo | 257/506 |

OTHER PUBLICATIONS

Merriam-Webster Online Dictionary www.m-w.com.*

* cited by examiner

*Primary Examiner*—Monica Lewis
(74) *Attorney, Agent, or Firm*—Lee & Morse, P.C.

(57) ABSTRACT

In a semiconductor device, and a method of fabricating the same, the semiconductor device includes a semiconductor substrate having a cell region and a peripheral circuit region, a portion of the semiconductor substrate in the cell region and in the peripheral circuit region including an isolation region defining an active region, a portion of the active region protruding above an upper surface of the isolation region to define at least two active channels, a gate dielectric layer formed over the active region of the semiconductor substrate including the at least two protruding active channels, a gate electrode formed over the gate dielectric layer and the isolation region of the semiconductor substrate, and a source/drain region formed in the active region of the semiconductor substrate on either side of the gate electrode.

21 Claims, 27 Drawing Sheets

FIG. 1
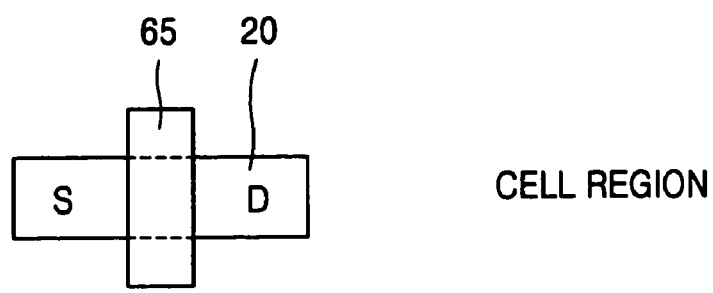
CELL REGION
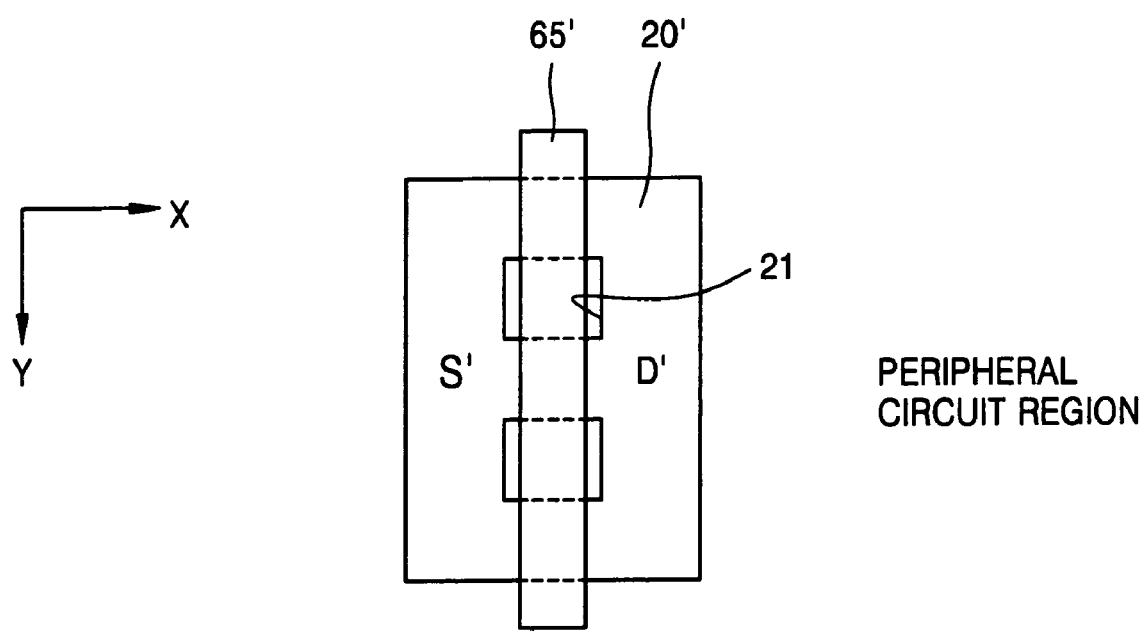
PERIPHERAL CIRCUIT REGION

FIG. 2    CELL REGION
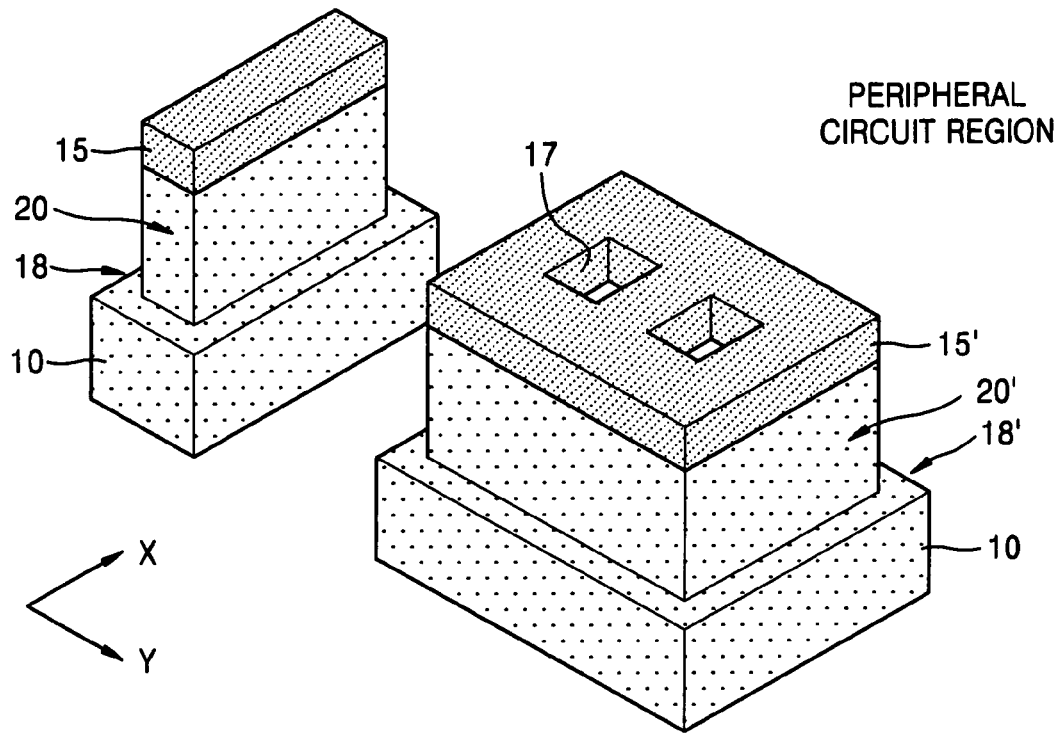
FIG. 3    CELL REGION
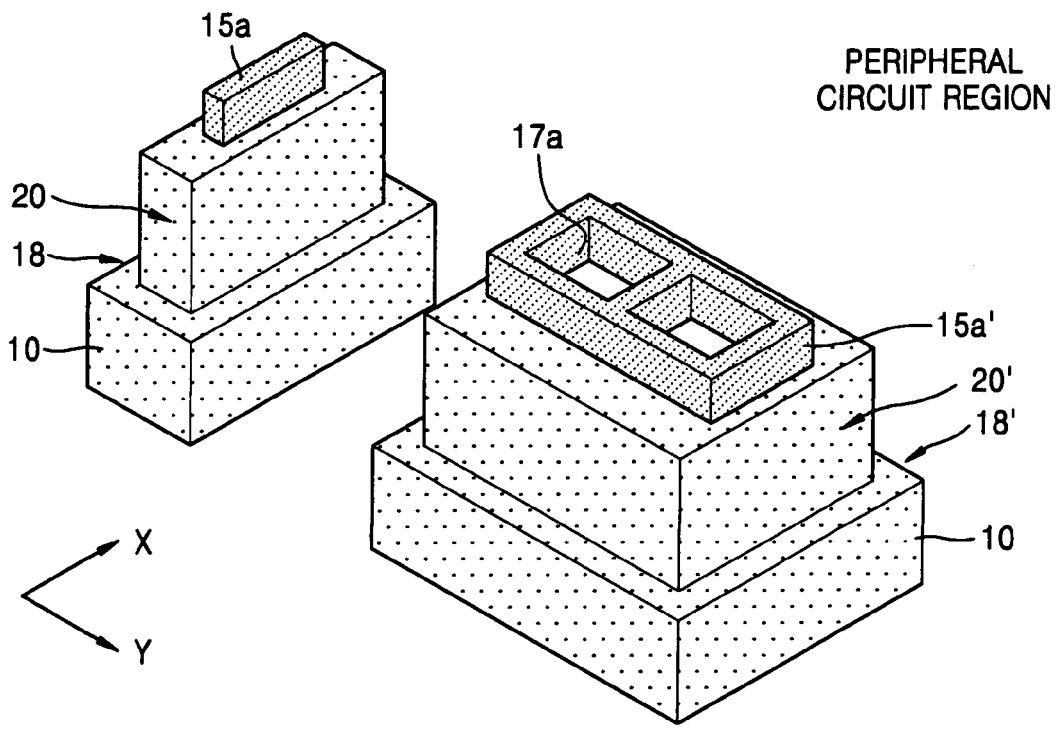

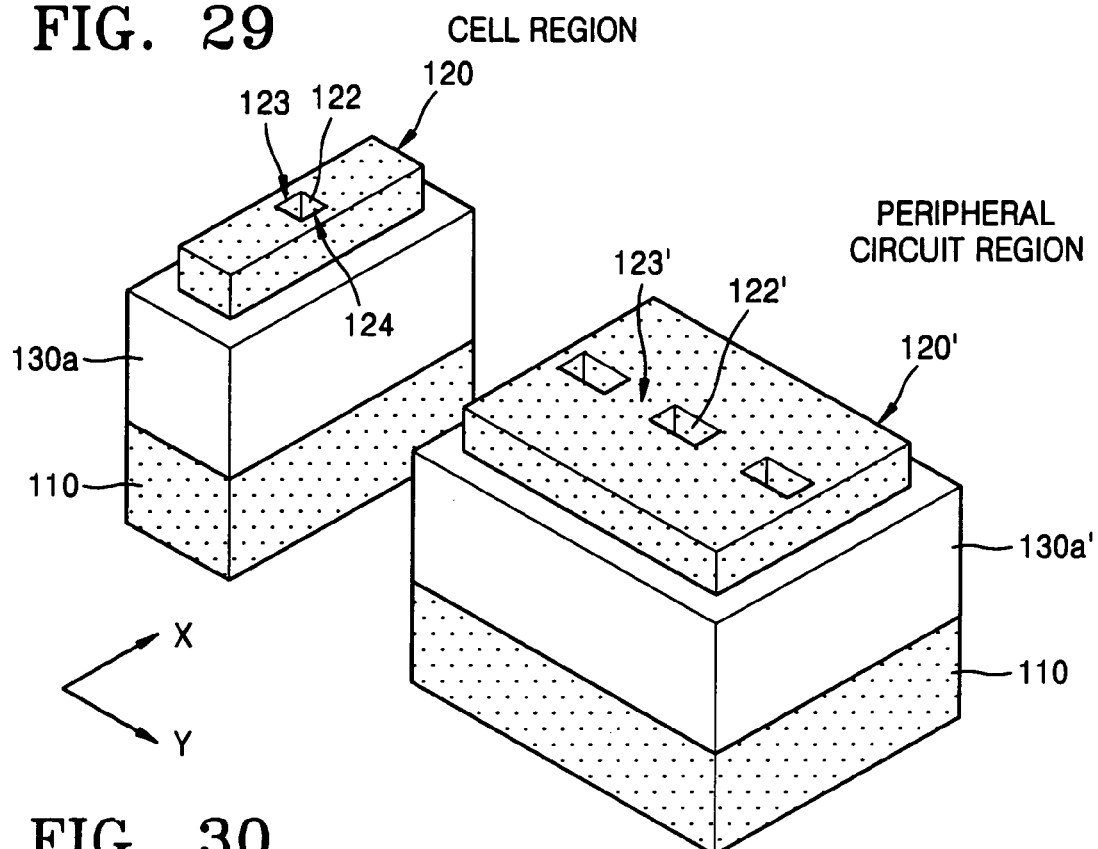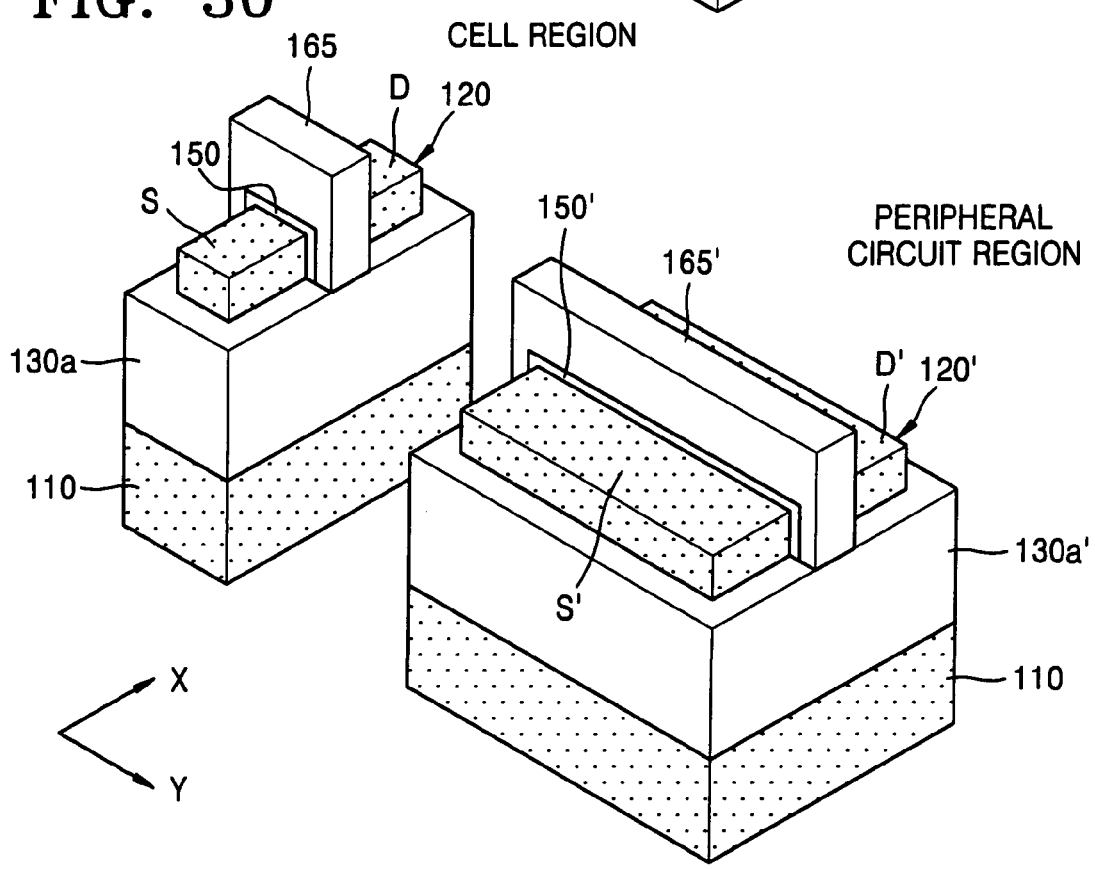

FIG. 31
CELL REGION    PERIPHERAL CIRCUIT REGION
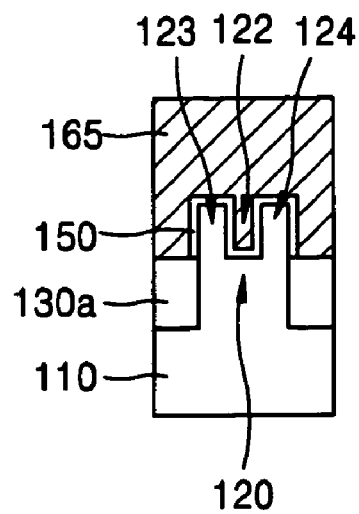
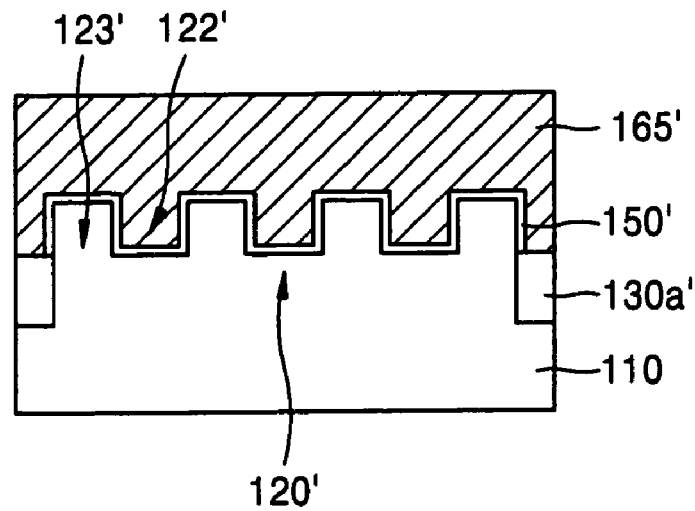

FIG. 42

| DEVICE | PLANAR MOSFET | SINGLE CHANNEL FinFET | MULTI-CHANNEL FinFET |
|---|---|---|---|
| CELL REGION PLANAR MOSFET 100nm (FIN HEIGHT 100nm) | | | |
| EFFECTIVE CHANNEL LENGTH | 100nm | 300nm | 500nm |
| PERIPHERAL CIRCUIT REGION PLANAR MOSFET 500nm (FIN HEIGHT 100nm) | | | |
| EFFECTIVE CHANNEL LENGTH | 500nm | TYPE 1: 1300nm TYPE 2: 900nm | 1500nm |

SEMICONDUCTOR DEVICE INCLUDING A MULTI-CHANNEL FIN FIELD EFFECT TRANSISTOR INCLUDING PROTRUDING ACTIVE PORTIONS AND METHOD OF FABRICATING THE SAME

BACKGROUND OF THE INVENTION

1. Field of the Invention

The present invention relates to a semiconductor device including a multi-channel fin field effect transistor (FinFET) and a method of fabricating the same. More particularly, the present invention relates to a semiconductor device including a multi-channel FinFET in a cell and/or peripheral circuit region of a semiconductor substrate and a method of fabricating the same.

2. Description of the Related Art

In order to improve performance and reduce fabrication cost of semiconductor devices, an integration density of semiconductor devices must continually increase. Increasing integration density of semiconductor devices requires developing techniques for reducing a feature size of a semiconductor device.

In conventional semiconductor fabricating processes, the channel length of a metal-oxide-semiconductor field effect transistor (MOSFET) is decreased to increase an operating speed and integration density of a semiconductor device. This decrease in channel length, however, may degrade characteristics of the device as an active switch. For example, as a distance between a source and a drain is further reduced, a short channel effect occurs. Thus, it becomes difficult to effectively suppress an influence of a drain electrical potential on a source electrical potential and a channel electrical potential. However, since a conventional MOSFET, in which a channel is disposed parallel on a surface of a semiconductor, is a planar channel device, it is difficult to not only structurally scale down the MOSFET, but also to suppress the occurrence of the short channel effect.

A FinFET has a structure, in which a fin-shaped, three-dimensional active region is formed, and both lateral surfaces and a top surface of the fin-shaped active region are surrounded by a gate. Thus, the FinFET includes not a planar channel but a three-dimensional channel. Unlike a planar MOSFET, since the FinFET includes a vertical channel disposed on a substrate, the size of the FinFET can be scaled down, and a short channel effect may decrease by greatly reducing a junction capacitance of a drain. In addition, the FinFET offers other superior electrical properties such as higher drive current and lower leakage current induced by improved sub-threshold current and reduced drain induced barrier lowering (DIBL). Accordingly, in view of these advantages of the FinFET, extensive research into replacing conventional MOSFETs with FinFETs has recently been conducted.

Although the FinFET offers these superior electrical characteristics, it is currently difficult to make a FinFET having a very short and uniform channel width transistor, e.g., less than 30 nm, because of the limitations of current lithography techniques. These limitations lead to other disadvantages. For example, if fins are not formed to a uniform width, a current dispersion characteristic may be deteriorated. To form a three-dimensional channel on a substrate in a FinFET, a photolithography process must be performed. However, a line width that can be obtained by the photolithography process is limited. Therefore, an improved method for forming a three-dimensional channel having a fine line width below a resolution limit is required.

Moreover, to appropriately control a current increased by forming a FinFET in a cell region, a transistor of a peripheral circuit region requires change. However, the layout of a conventional active region should be adjusted in accordance with a new fin structure to form a FinFET in a peripheral circuit region, and photoresist trimming should be used to obtain a fine line width. Thus, it is difficult to increase a contact region of a source and a drain due to the above-described patterning problems.

By fabricating a relatively short multi-channel transistor of a fin type, the transistor's drive current level may be increased. Therefore, new semiconductor devices including multi-channel FinFETs having uniform and relatively short channel width and methods of fabricating the same are needed.

SUMMARY OF THE INVENTION

The present invention is therefore directed to a semiconductor device including a multi-channel FinFET and a method of fabricating the same, which substantially overcome one or more of the problems due to the limitations and disadvantages of the related art.

It is a feature of an embodiment of the present invention to provide a semiconductor device including a multi-channel FinFET and a method of fabricating the same, wherein the multi-channel FinFET has a uniform fine line width disposed in either a cell region and/or a peripheral circuit region.

It is another feature of an embodiment of the present invention to provide a semiconductor device including a multi-channel FinFET and a method of fabricating the same, wherein the multi-channel FinFET has a short and uniform channel width.

It is yet another feature of an embodiment of the present invention to provide a semiconductor device including a multi-channel FinFET and a method of fabricating the same that significantly increases an effective channel length of the transistor.

It is still another feature of an embodiment of the present invention to provide a semiconductor device including a multi-channel FinFET and a method of fabricating the same that is able to increase a current level of a transistor, thereby increasing an operating speed of the semiconductor device, by providing a plurality of fin-type active channels in the transistor.

It is yet still another feature of an embodiment of the present invention to provide a semiconductor device including a multi-channel FinFET and a method of fabricating the same that is able to produce a lower cost FinFET gate having a plurality of fin-type active channels using a simplified manufacturing process.

It is a further feature of an embodiment of the present invention to form a transistor having one or more three-dimensional channels in a single active region by forming fins having a uniform fine line width in a cell region and/or a peripheral circuit region of the semiconductor device.

At least one of the above features and other advantages may be provided by a semiconductor device including a semiconductor substrate having a cell region and a peripheral circuit region, a portion of the semiconductor substrate in the cell region and in the peripheral circuit region including an isolation region defining an active region, a portion of the active region protruding above an upper surface of the isolation region to define at least two active channels, a gate dielectric layer formed over the active region of the semiconductor substrate including the at least two protruding active channels, a gate electrode formed over the gate dielectric layer and the isolation region of the semiconductor substrate, and a source/drain region formed in the active region of the semiconductor substrate on either side of the gate electrode.

The semiconductor substrate may be selected from the group consisting of a bulk silicon wafer, a silicon-on-insulator (SOI) substrate, a silicon germanium-on-insulator (SGOI) substrate, and a SiGe wafer.

The at least two active channels may be parallel. Each of the at least two protruding active channels may have a width of about 30 nm or less.

An upper surface of the active region between the at least two protruding active channels may be level with the upper surface of the isolation region in the semiconductor substrate. Alternatively, the active region between the at least two protruding active channels may be recessed so that an upper surface of the active region between the at least two protruding active channels is lower than the upper surface of the isolation region in the semiconductor substrate. As a further alternative, an upper surface of the active region between the at least two protruding active channels may be higher than the upper surface of the isolation region in the semiconductor substrate.

The at least two protruding active channels may be cell region active channels formed in the cell region of the semiconductor substrate.

The device may further include a portion of the active region in the peripheral circuit region of the semiconductor substrate protruding above the upper surface of the isolation region in the peripheral circuit region of the semiconductor substrate to define a plurality of peripheral circuit region active channels.

The at least two protruding active channels may be peripheral circuit region active channels formed in the peripheral circuit region of the semiconductor substrate.

A first portion of the at least two protruding active channels may be cell region active channels formed in the cell region of the semiconductor substrate and a second portion of the at least two protruding active channels may be peripheral circuit region active channels formed in the peripheral circuit region of the semiconductor substrate.

The active region under each of the plurality of peripheral circuit region active channels may be separated by the isolation region.

The device may further include a portion of the active region in the cell region of the semiconductor substrate protruding above the upper surface of the isolation region in the cell region of the semiconductor substrate to define a cell region active channel.

The at least two protruding active channels may be cell region active channels formed in the cell region of the semiconductor substrate and the device may further include a portion of the active region in the peripheral portion of the semiconductor substrate protruding above the upper surface of the isolation region in the peripheral circuit region of the semiconductor substrate to define a plurality of peripheral circuit region active channels formed in the peripheral circuit region of the semiconductor substrate.

At least two of the plurality of peripheral circuit region active channels that protrude above the upper surface of the isolation region in the peripheral circuit region of the semiconductor substrate may be adjacent to the isolation region. Alternatively, the plurality of peripheral circuit region active channels that protrude above the upper surface of the isolation region in the peripheral circuit region of the semiconductor substrate may be separated from the isolation region by a predetermined distance.

At least one of the above features and other advantages may be provided by a method of fabricating a semiconductor device including preparing a semiconductor substrate having a cell region and a peripheral circuit region, a portion of the semiconductor substrate in the cell region and in the peripheral circuit region including an isolation region defining an active region, forming at least two active channels having a portion of the active region therebetween, the at least two active channels protruding above an upper surface of the isolation region, depositing a gate dielectric layer over the active region of the semiconductor substrate including the at least two protruding active channels, forming a gate electrode over the gate dielectric layer and the isolation region of the semiconductor substrate, and forming a source/drain region in the active region of the semiconductor substrate on either side of the gate electrode.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 1 illustrates a plan view of a semiconductor device formed by a method of fabricating a semiconductor device according to a first through fourth embodiment of the present invention;

FIGS. 2 through 9 illustrate perspective views of stages in a method of fabricating a semiconductor device including a multi-channel FinFET in accordance with a first embodiment of the present invention;

FIGS. 21 through 30 illustrate perspective views of stages in a method of fabricating a semiconductor device in accordance with a fifth embodiment of the present invention;

FIG. 31 illustrates a cross-sectional view, taken along the y-direction, of a semiconductor device according to the fifth embodiment of the present invention as shown in FIG. 30;

FIG. 42 is a table showing results of a comparison of channel lengths of a semiconductor device including a conventional planar metal-oxide-semiconductor field effect transistor (MOSFET) and a semiconductor device including FinFETs according to the embodiments of the present invention.

DETAILED DESCRIPTION OF THE INVENTION

Figure 4:
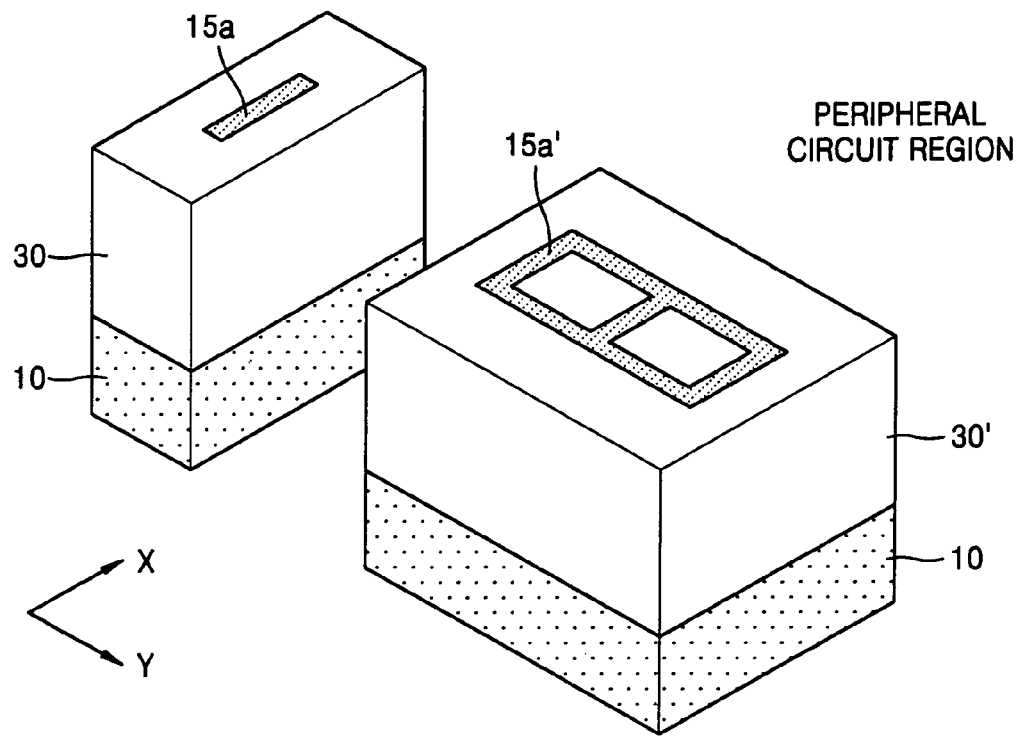

Korean Patent Application No. 2004-49003, filed on Jun. 28, 2004, in the Korean Intellectual Property Office, and entitled: "Semiconductor Device Including FinFET and Method of Fabricating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals and characters in different drawings represent like elements throughout. Further, throughout the drawings, a left portion of the figure illustrates a cell region of a semiconductor device and a right portion of the figure illustrates a peripheral circuit region of the semiconductor device.

First through Fourth Embodiments

FIG. 1 illustrates a plan view of a semiconductor device formed by a method of fabricating a semiconductor device according to a first through fourth embodiment of the present invention.

Referring to FIG. 1, a semiconductor device is divided into a cell region and a peripheral circuit region. The cell region includes an active region 20 and a gate electrode 65. The active region 20 and the gate electrode 65, which is formed on the active region 20, are perpendicular relative to one another. For example, a length of the active region 20 may extend in an x-direction and a length of the gate electrode 65 may extend in a y-direction. The active region 20 includes a source S and a drain D formed on either side of the gate electrode 65.

The peripheral circuit region includes an active region 20' and a gate electrode 65', which is formed on the active region 20'. The active region 20' and the gate electrode 65' are both substantially rectangular in shape. A length of the gate electrode 65', e.g., which may extend in the y-direction, is larger than a length of the active region 20', which may similarly extend in the y-direction. A width of the gate electrode 65', e.g., which may extend in the x-direction, however, is smaller than a width of the active region 20', which may similarly extend in the x-direction. When the width of the active region 20' in the peripheral circuit region, i.e., in the x-direction, is equal to the length of the active region 20 in the cell region, i.e., also in the x-direction, an area of the active region 20' in the peripheral circuit region is greater than that of the active region 20 in the cell region. The active region 20' includes a source S' and a drain D' formed on either side of the gate electrode 65'.

Openings 21, which may have a substantially rectangular shape, are formed in the active region 20' in the peripheral circuit region. The openings 21 are formed under the gate electrode 65' at a predetermined interval. Because an upper surface of the active region 20' in the peripheral circuit region is exposed through the openings 21, top portions of the active region 20' are separated by the openings 21 in a line-and-space-type pattern.

Although FIG. 1 illustrates an exemplary number of openings 21 in the active region 20' of the peripheral circuit region, i.e., two (2), the actual number of openings 21 may be greater than or less than two (2). Further, the length of the active region 20' in the peripheral circuit region may be varied depending on the number of openings 21 actually formed. In the context of the present invention, the active region 20' of the peripheral circuit region may include one or more openings 21, however, through the following embodiments and figures, two (2) openings 21 are exemplarily described and illustrated.

As shown in FIG. 1, contact regions formed in the sources of the cell region and the peripheral circuit region S and S', respectively, and the drains of the cell region and the peripheral circuit region D and D', respectively, are larger in a width direction of the gate electrodes 65 and 65' than the gate electrodes 65 and 65'. Accordingly, the present invention is able to reduce problems caused by a conventional patterning process and provide sufficient contact regions of the source/drains.

First Embodiment

FIGS. 2 through 9 illustrate perspective views of stages in a method of fabricating a semiconductor device in accordance with a first embodiment of the present invention.

Referring to FIG. 2, hard mask layers 15 and 15' are deposited on a semiconductor substrate 10. Subsequently, the hard mask layers 15 and 15' will be patterned to define active regions 20 and 20' of the semiconductor substrate 10. The semiconductor substrate 10 may be a bulk silicon wafer, a silicon-on-insulator (SOI) substrate, a silicon germanium-on-insulator (SGOI) substrate, or a silicon germanium (SiGe) wafer. The hard mask layers 15 and 15' may be formed simultaneously in both the cell region and the peripheral circuit region.

To form the hard mask layers 15 and 15', an insulating layer, such as a silicon nitride layer, is deposited on the substrate 10 to a thickness of about 800 to 2000 Å, and is patterned along the cell region and the peripheral circuit region to form predetermined shapes. The insulating layer may be deposited using plasma-enhanced chemical vapor deposition (PECVD) or low-pressure CVD (LPCVD). As shown in FIG. 2, the hard mask layer 15 formed in the cell region is substantially rectangular and extends in the x-direction. The hard mask layer 15' formed in the peripheral circuit region includes substantially rectangular openings 17.

Prior to depositing the hard mask layers 15 and 15', a buffer layer, e.g., a thermal oxide layer, may be deposited on the semiconductor substrate to reduce stress between the hard mask layers 15 and 15' and the substrate 10.

To form the active regions 20 and 20', the semiconductor substrate 10 is etched using the hard mask layers 15 and 15' as etch masks. Active regions 20 and 20' protrude from an upper surface of the substrate 10 in both the cell region and the peripheral circuit region, respectively. This etching forms a shallow trench 18 and 18' under each opening 17 in the hard mask layer 15' of the peripheral circuit region and surrounding the active regions 20 and 20'. The trench 18 and 18' may be formed to a depth of about 1000 to 3000 Å. The substrate 10 may be dry etched using a gas mixture of a halogen gas, such as HBr or $C_{12}$, and $O_2$.

Referring to FIG. 3, the hard mask layers 15 and 15' are isotropically etched to form hard mask patterns 15a and 15a'. The isotropic etching of the hard mask layers 15 and 15' narrows the hard mask layers 15 and 15' and an upper surface of edge portions of the active regions 20 and 20' are exposed. Isotropically etching the hard mask layers 15 and 15' may be performed by a blanket etching, or a pull-back process, which requires no etch mask. When the hard mask layers 15 and 15' are formed of silicon nitride, a wet etching using phosphoric acid ($H_3PO_4$) or a dry etching using plasma may be performed. Resultantly, the hard mask patterns 15a and 15a' are formed in the cell region and the peripheral circuit region, respectively.

During the isotropic etching of the hard mask layers 15 and 15', both the lengths and widths of the hard mask layers 15 and 15' are reduced, i.e., the hard mask layers 15 and 15' are narrowed. In addition, a size of the openings 17 is increased. A width of the fin can be controlled by adjusting a time that the isotropic etching, i.e., the pull back process, is performed.

Referring to FIG. 4, a first dielectric layer 30 and 30', e.g., an insulating material such as a gap filling oxide layer, is deposited to fill the trenches 18 and 18' and to surround the active regions 20 and 20'. The first dielectric layer 30 and 30' is then planarized until an upper surface of the hard mask patterns 15a and 15a', i.e., the narrowed hard mask layers, is exposed. The first dielectric layer 30 and 30' may be deposited using high density plasma (HDP)-CVD. The first dielectric layer 30 and 30' may be planarized using a chemical mechanical polishing (CMP) or a blanket etching.

Figure 5:
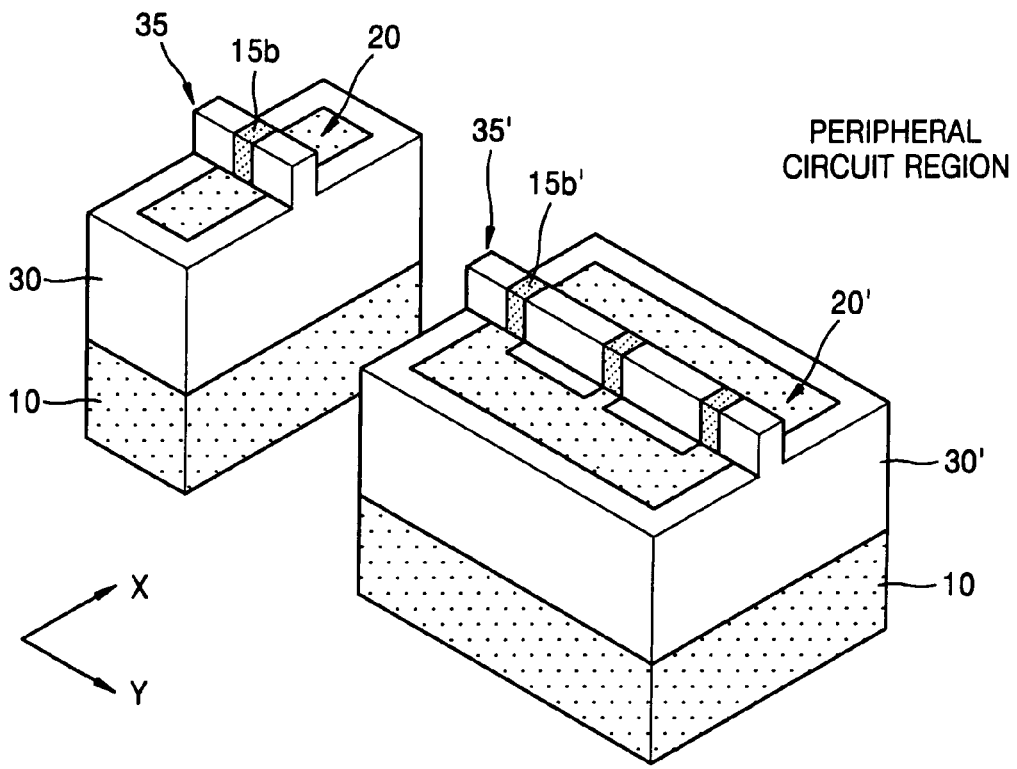

Referring to FIG. 5, the first dielectric layer 30 and 30' and the hard mask patterns 15a and 15a' are patterned to form dummy gate patterns 35 and 35' in the cell region and the peripheral circuit region, respectively. The first dielectric layer 30 and 30', e.g., an oxide, and the hard mask patterns 15a and 15a', e.g., a nitride, may be etched simultaneously to form the dummy gate patterns 35 and 35'. The dummy gate patterns 35 and 35' are formed where gate electrodes 65 and 65' of FIG. 1 will be subsequently formed, i.e., to extend in the y-direction. During the formation of the dummy gate patterns 35 and 35', most of the hard mask patterns 15a and 15a' are removed. Resultantly, a single channel region defining pattern 15b is formed in a center of the cell region and a plurality of channel regions defining regions 15b' is formed in the peripheral circuit region. The plurality of channel regions defining patterns 15b' extends in the y-direction through a center of the peripheral circuit region. Portions of an upper surface of the active regions 20 and 20', which are disposed under the dummy gate patterns 35 and 35', respectively, are exposed by the formation of the dummy gate patterns 35 and 35'.

Figure 6:
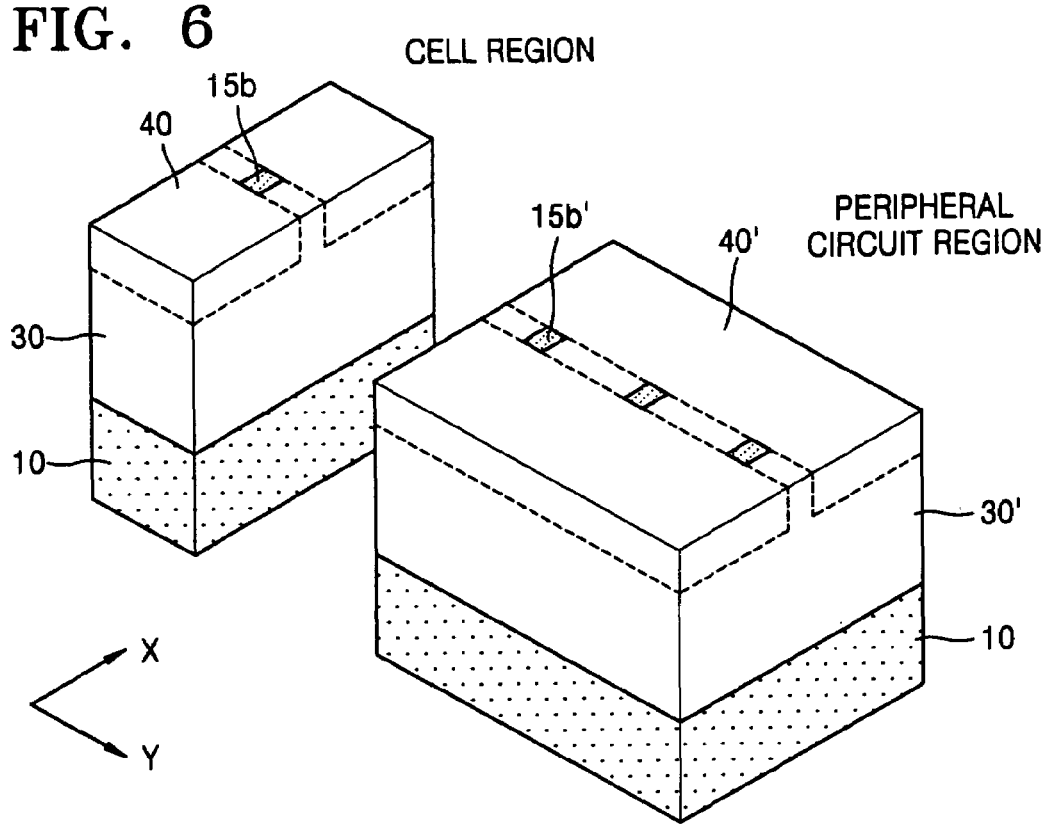

Referring to FIG. 6, a second dielectric layer 40 and 40', i.e., a blocking layer, is deposited on the dummy gate patterns 35 and 35'. The second dielectric layer 40 and 40' may be a silicon oxide layer. The second dielectric layer 40 and 40' is then planarized until an upper surface of the channel region defining patterns 15b and 15b' is exposed. The second dielectric layer 40 and 40' may be deposited using HDP-CVD, which is similarly used to deposit the first dielectric layer 30 and 30'. In addition, the second dielectric layer 40 and 40' may be planarized using CMP or blanket etching. Since the second dielectric layer 40 and 40' and the first dielectric layer 30 and 30' may be similar or identical oxide layers, there may not be a distinct interface therebetween. In any event, the second dielectric layer 40 and 40' and the first dielectric layer 30 and 30' are shown as distinct layers using dotted lines in the figures.

Figure 7:
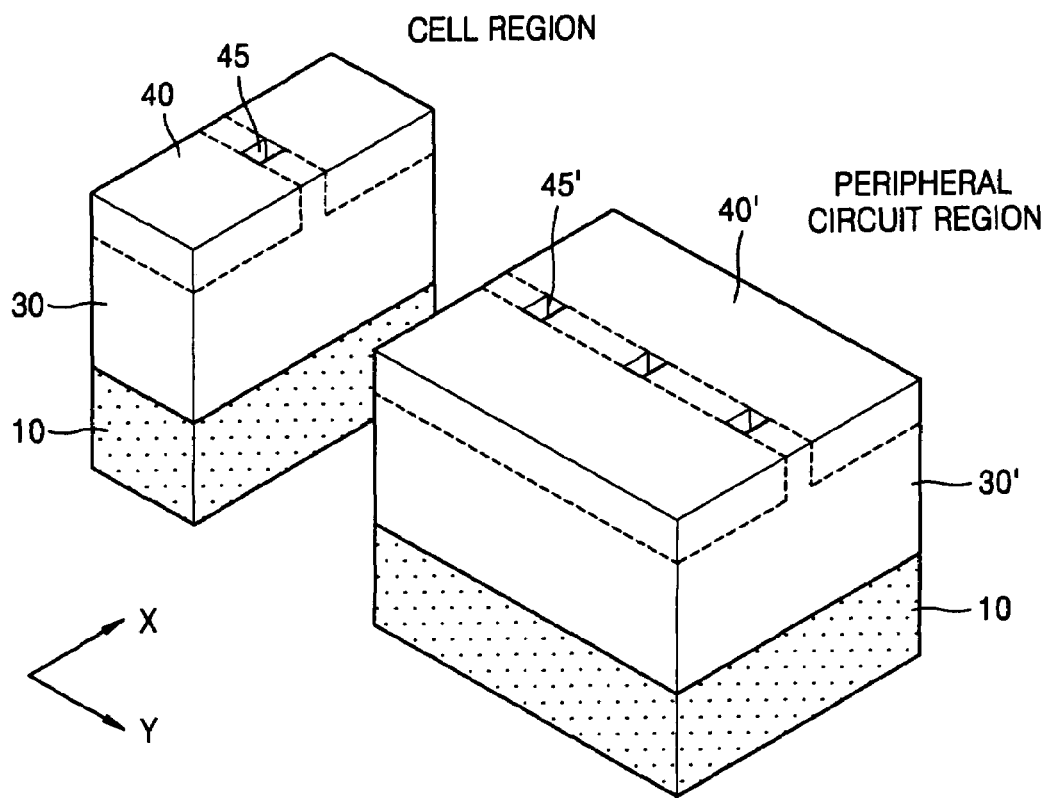

Referring to FIG. 7, the channel region defining patterns 15b and 15b', which were exposed by the planarization process described in connection with to FIG. 6, are selectively removed using wet or dry etching with respect to the second dielectric layer 40 and 40', the first dielectric layer 30 and 30', and the substrate 10. The channel region defining patterns 15b and 15b', which may be formed of silicon nitride, may be removed by a wet etching using $H_3PO_4$. Resultantly, openings 45 and 45' are formed where the channel region defining regions 15b and 15b' are removed, and upper surfaces of the active regions 20 and 20' under the openings 45 and 45' are exposed. The active regions 20 and 20' under the openings 45 and 45' are then anisotropically etched using the second dielectric layer 40 and 40' and the first dielectric layer 30 and 30' as an etch mask to define portions to be used as fin channels.

As described above, the width of the fin in the cell region is the difference between the width of the active region 20 and the width of the hard mask pattern 15a. The width of the fin in the peripheral circuit region is similarly defined.

At this time, a channel ion implantation process may be performed on the exposed active regions 20 and 20'. Alternatively, several channel ion implantation processes may be performed at different energies such that channel ions are uniformly distributed in fin channels. For example, a first boron implantation may be performed at 30 keV and then a second boron implantation may be performed at 15 keV. The channel ion implantation process may be performed perpendicularly to the upper surface of the substrate 10.

Figure 8:
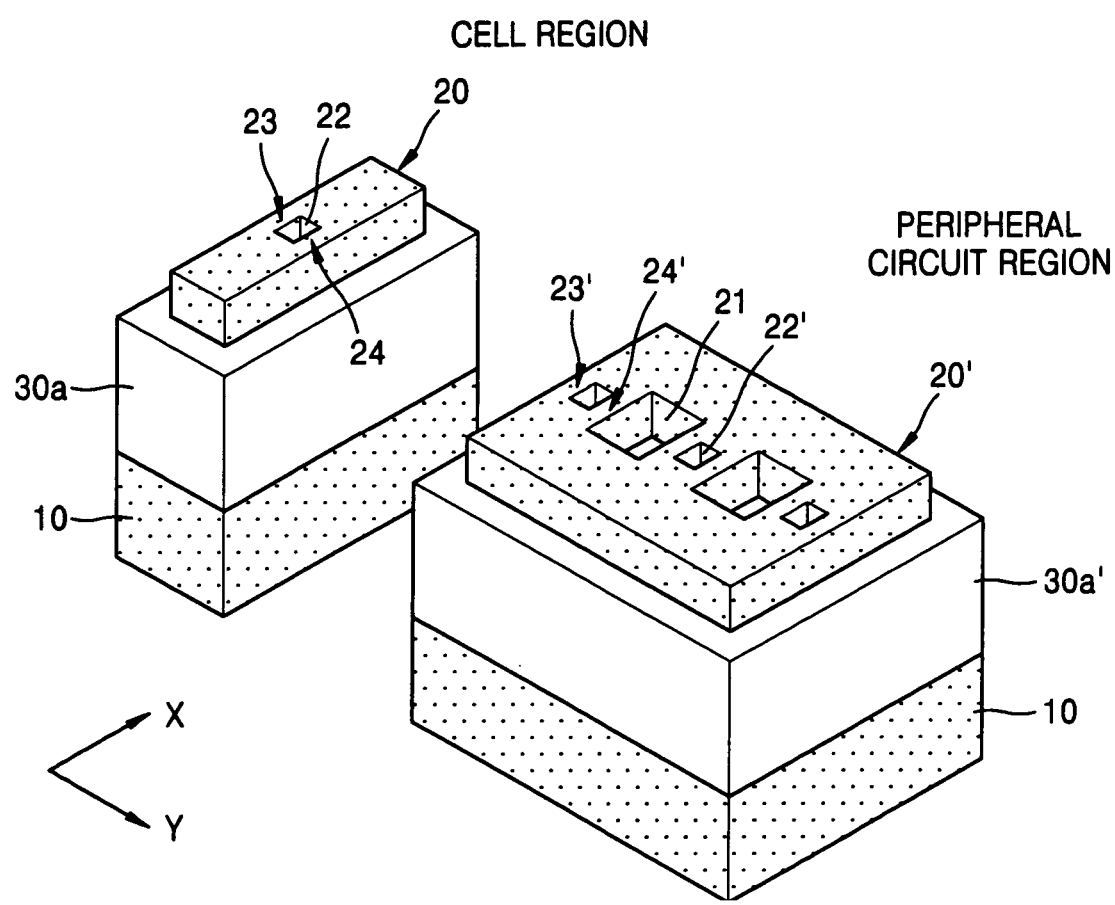

Referring to FIG. 8, the second dielectric layer 40 and 40', i.e., the blocking layer, and the first dielectric layer 30 and 30', i.e., the gap filling oxide layer, are recessed using an anisotropic etching to a same depth as a channel depth. The second dielectric layer 40 and 40' and the first dielectric layer 30 and 30' may be wet recessed using a diluted HF or a buffered oxide etchant (BOE) solution. Resultantly, an isolation region 30a and 30a', e.g., a shallow trench isolation region, is formed around the exposed active regions 20 and 20'. The active region 20' of the peripheral circuit region includes rectangular openings 21 as shown in FIG. 1. In addition, central trenches 22 and 22' are formed around the fin channels of the active regions 20 and 20', respectively, by etching the active regions 20 and 20' through the openings 45 and 45' as described with reference to FIG. 7.

As a result, first protrusions 23 and 23' and second protrusions 24 and 24', which are comprised of the surface of the substrate 10 in the active regions 20 and 20', are exposed between the central trenches 22 and 22' and the isolation region 30a and 30a'. Top surfaces and lateral surfaces of the first protrusions 23 and 23' and the second protrusions 24 and 24' form three-dimensional active channel regions. The first protrusion 23 and the second protrusion 24 in the cell region form cell region active channels. The first protrusions 23' and the second protrusions 24' in the peripheral circuit region form peripheral circuit region active channels. The first protrusions 23 and 23' and the second protrusions 24 and 24' are respectively separated from each other by the central trenches 22 and 22'. The first protrusions 23 and 23' and the second protrusions 24 and 24' may be parallel. In addition, the first protrusions 23 and 23' and second protrusions 24 and 24' may have a width of about 30 nm or less. In the context of the present invention, a fin having two protrusions separated by a central trench is referred to as a multi-channel fin. A fin field effect transistor (FinFET) that is fabricated using a multi-channel fin is referred to as a multi-channel FinFET. In the peripheral circuit region, a plurality of central trenches 22' may be formed aligned in the y-direction, so that a plurality of fins can be formed in a single active region.

Alternatively, a channel ion implantation process, which was described as being performed after forming the openings 45 and 45' in connection with FIG. 7 above, may instead be performed after the fins are exposed as described in connection with FIG. 8. As described above, several ion implantation processes may be performed at different energies so that channel ions can be uniformly distributed in the fin channels. In this case, the ion implantation processes are obliquely performed.

Figure 9:
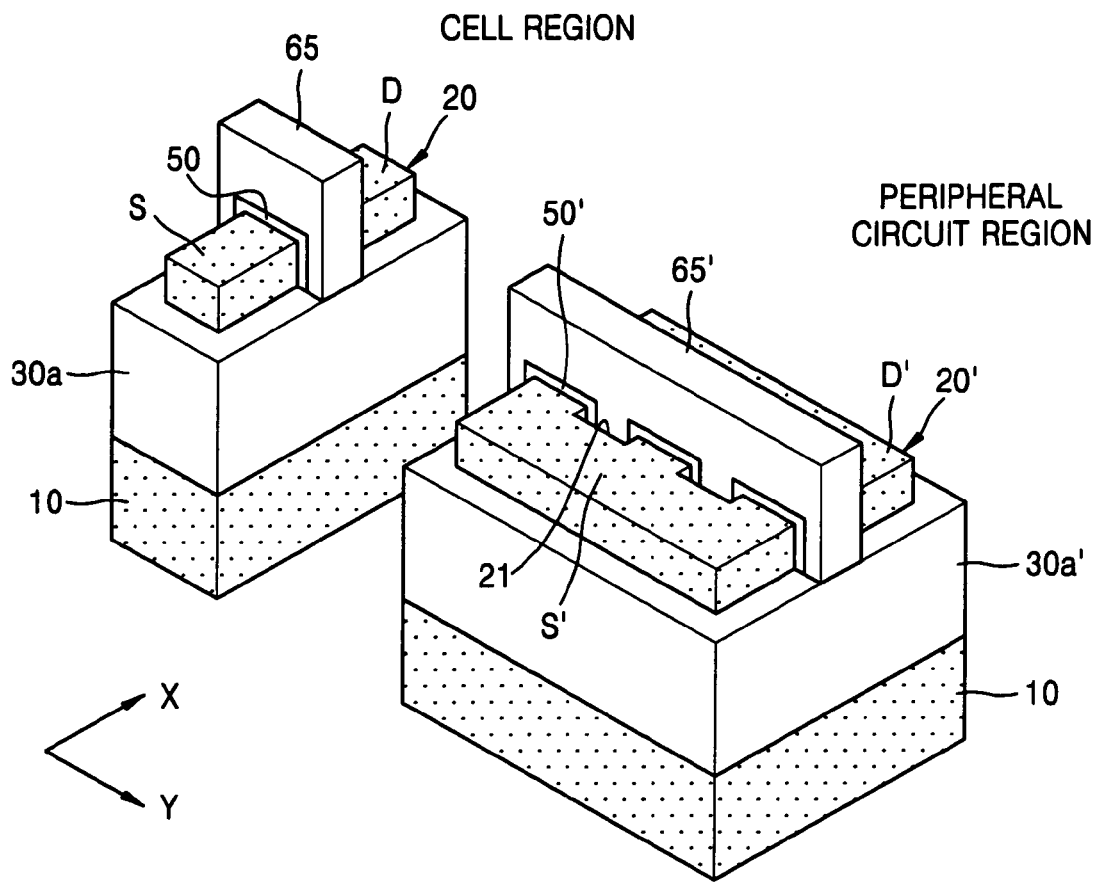

Referring to FIG. 9, a gate dielectric layer 50 and 50', e.g., a gate oxide layer, is formed on the active regions 20 and 20' and the isolation region 30a and 30a'. The gate dielectric layer 50 and 50' may be formed by growing a silicon oxide layer using thermal oxidation. Alternatively, the gate dielectric layer 50 and 50' may be formed of an insulating material such as silicon oxide, hafnium oxide, zirconium oxide, aluminum oxide, or silicon oxide, and may be deposited or coated using atomic layer deposition (ALD), CVD, plasma-enhanced ALD (PEALD), or PE-CVD.

Subsequently, a gate conductive layer (not shown) is formed on the gate dielectric layer 50 and 50'. To form the gate conductive layer, an undoped polysilicon layer may be formed, and then appropriately doped in a subsequent process, or an in-situ doped polysilicon layer may be formed. The gate conductive layer may be formed of a metal such as tungsten W. The gate conductive layer is then patterned to form gate electrodes 65 and 65', which extend in the y-direction, in the cell region and the peripheral circuit region, respectively. The gate electrodes 65 and 65' may be formed to have the same width as the central trenches 22 and 22', respectively, and to cover the top surfaces and lateral surfaces of the first protrusions 23 and 23' and the second protrusions 24 and 24', i.e., channel regions, across the channel regions, respectively.

Subsequently, impurity ions are implanted to form source and drain regions and are thermally treated. Thus, a source S and a drain D are formed in the active region 20 on either side of the gate electrode 65 in the cell region, and a source S' and a drain D' are formed in the active region 20' on either side of the gate electrode 65' in the peripheral circuit region. In this case, the layout is designed such that contact regions (not shown) of the sources S and S' and the drains D and D' are wider than the gate electrodes 65 and 65'. Accordingly, areas of the contact regions of the sources and the drains are not limited.

The source S and the drain D of the cell region and the source S' and the drain D' of the peripheral circuit region may each have a lightly doped drain (LDD) structure. In this case, a process of forming spacers on sidewalls of the gate electrodes 65 and 65' should be further performed between a high-concentration (about $10^{15}/cm^2$) ion implantation process and a low-concentration (about $10^{12}/cm^2$ to $10^{13}/cm^2$) ion implantation process.

The sizes of the central trenches 22 and 22' are determined by the sizes of the openings 45 and 45', respectively, and the sizes of the openings 45 and 45' are determined by the sizes of the channel region defining patterns 15b and 15b', respectively. Accordingly, to increase the areas of the sources S and S' and the drains D and D', the channel region defining patterns 15b and 15b' should be as small as possible. In the first embodiment of the present invention, the channel region defining patterns 15b and 15b' are formed to the same widths as the gate electrodes 65 and 65', respectively.

Figure 10:
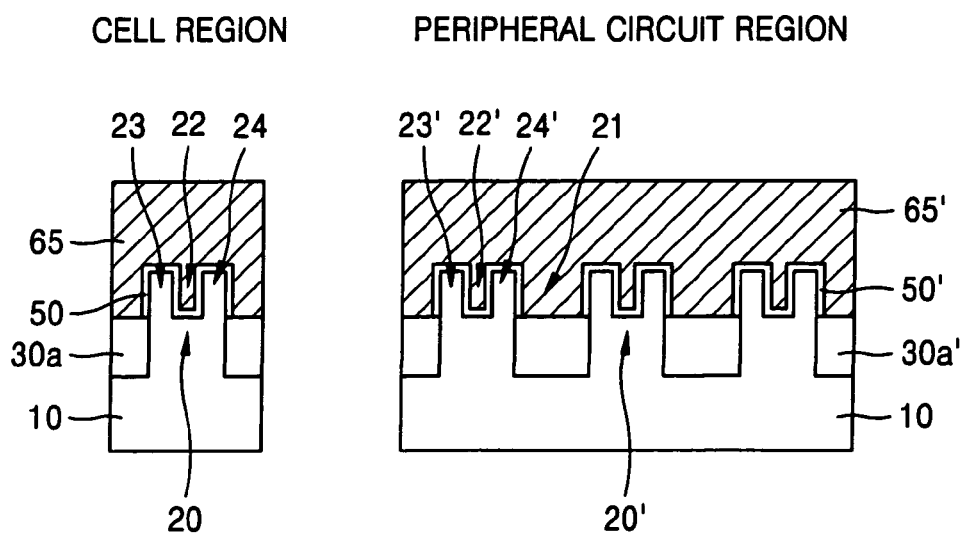
FIG. 10 illustrates a cross-sectional view, taken along the y-direction, of a semiconductor device according to the first embodiment of the present invention as shown in FIG. 9.

FIG. 10 illustrates a cross-sectional view, taken along the y-direction, of a semiconductor device according to the first embodiment of the present invention as shown in FIG. 9.

Referring to FIG. 10, a multi-channel fin or a plurality of multi-channel fins is formed in the cell region and the peripheral circuit region, respectively. Since the second dielectric layer 40 and 40' and the first dielectric layer 30 and 30' are recessed to the same depth as that of the channels, as described above in connection with FIG. 8, bottoms of the central trenches 22 and 22' are on a same level as an upper surface of the isolation region 30a and 30a'. More specifically, an upper surface of the active regions 20 and 20' between the protruding active channels is level with the upper surface of the isolation region 30a and 30a' in the semiconductor substrate. In the first embodiment, the active region 20' of the peripheral circuit region has a plurality of multi-channel fins to provide a plurality of active channel regions. Although three (3) multi-channel fins are exemplarily shown in the first embodiment, the number of multi-channel fins actually formed in the peripheral circuit region may vary depending on the number of openings 21 formed in the active region 20'. To control a current that is increased as the three-dimensional multi-channel fin is formed in the cell region, it is preferable that the multi-channel fins be also formed in the peripheral circuit region, as in the first embodiment.

As a result of the above-described method, a multi-channel FinFET according to the first embodiment of the present invention includes the semiconductor substrate 10 having the cell region and the peripheral circuit region. A portion of the substrate 10 in the cell region includes the isolation region 30a defining the active region 20 and a portion of the substrate 10 in peripheral circuit region includes the isolation region 30a' defining the active region 20'. The isolation region 30a and 30a' is disposed around the active regions 20 and 20' and the under the openings 21. A portion of the active region 20 in the cell region protrudes above the upper surface of the semiconductor substrate 10 and the isolation region 30a. A portion of the active region 20' in the peripheral circuit region protrudes above the upper surface of the semiconductor substrate 10 and the isolation region 30a'.

The protruding portions of the active regions 20 and 20' include the first protrusions 23 and 23' and the second protrusions 24 and 24', and define the fins, i.e., the active channels. Top surfaces and lateral surfaces of the first protrusions 23 and 23' and the second protrusions 24 and 24' are active channel regions. The first protrusions 23 and 23' and the second protrusions 24 and 24' are respectively comprised of the surfaces of the active regions 20 and 20', separated by the central trenches 22 and 22', and may be parallel to the second protrusions 24 and 24'. In the active region 20' of the peripheral circuit region, a plurality of central trenches 22' are formed in a row, and, thus, a plurality of fins are formed. In the first embodiment, the upper surface of the active region 20 and 20' between the first protrusions 23 and 23' and the second protrusions 24 and 24' is level with the upper surface of the isolation regions 30a and 30a', respectively. The first protrusion 23 and the second protrusion 24 in the cell region form cell region active channels. The first protrusions 23' and the second protrusions 24' in the peripheral circuit region form peripheral circuit region active channels.

The gate dielectric layer 50 and 50' and the gate electrodes 65 and 65' are formed on the active regions 20 and 20' and the isolation region 30a and 30a'. The gate electrodes 65 and 65', which have the same widths as the central trenches 22 and 22', respectively, extend in the y-direction and cover top surfaces and lateral surfaces of the first protrusions 23 and 23' and the second protrusions 24 and 24'. In particular, the gate electrode 65' of the peripheral circuit region extends across the plurality of central trenches 22'.

The sources S and S' and the drains D and D' are formed in the active regions 20 and 20' on either side of the gate electrodes 65 and 65', respectively. The widths of the contact regions formed in the sources S and S' and the drains D and D' are larger than those of the gate electrodes 65 and 65', respectively.

As described above, a semiconductor device according to the first embodiment of the present invention provides contact regions of the sources and drains, which are wider than the channel widths. Further, the device according to the first embodiment of the present invention includes multi-channel fins, which are disposed in the active regions of the cell region and the peripheral circuit region, each having two protrusions separated by a central trench. In the present invention, a width of a multi-channel fin is not limited. Since the fins are formed to each have two protrusions, channel areas are increased, thereby improving the operating speed of the semiconductor device.

Although a substrate is described as being a bulk silicon substrate, a silicon-on-insulator (SOI) substrate, a silicon germanium-on-insulator (SGOI) substrate, or an SiGe substrate may be used. If a bulk silicon substrate is used, as compared to an SOI or an SGOI substrate, fabrication cost is reduced and the semiconductor device avoids a floating body effect, a drop in breakdown voltage between a source and a drain, and an increase in off-current. Alternatively, an SOI or an SGOI substrate can prevent a bottom channel from being turned on. In addition, an SGOI substrate or a SiGe substrate may be useful due to the faster mobility of the substrate material.

Second Embodiment

Figure 11A:
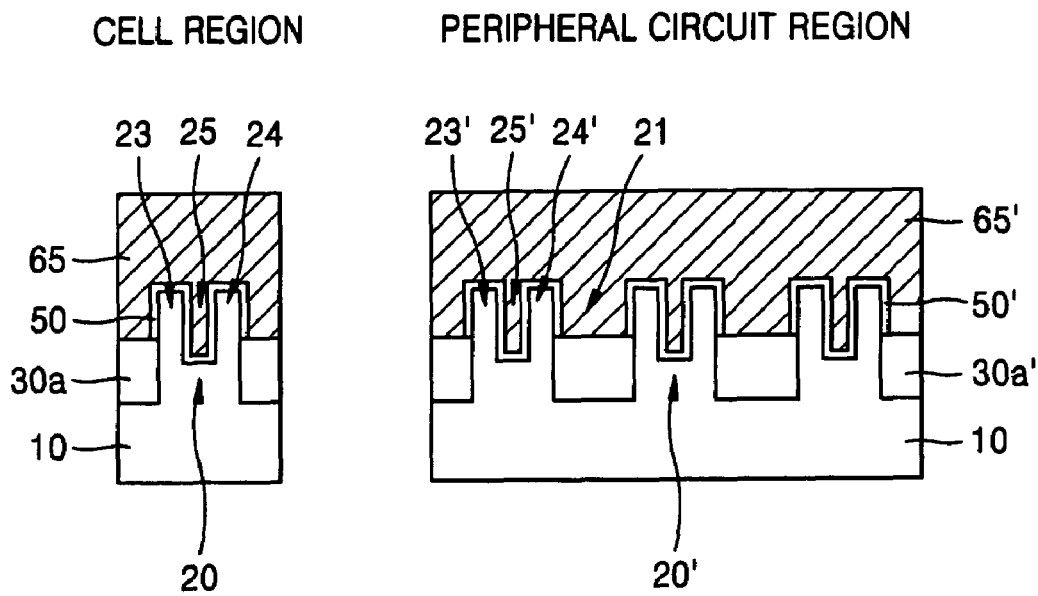
FIGS. 11A and 11B illustrate cross-sectional views, taken along the y-direction, of a semiconductor device in accordance with a second embodiment of the present invention and a semiconductor device in accordance with an alternative second embodiment of the present invention, respectively.
Figure 11B:
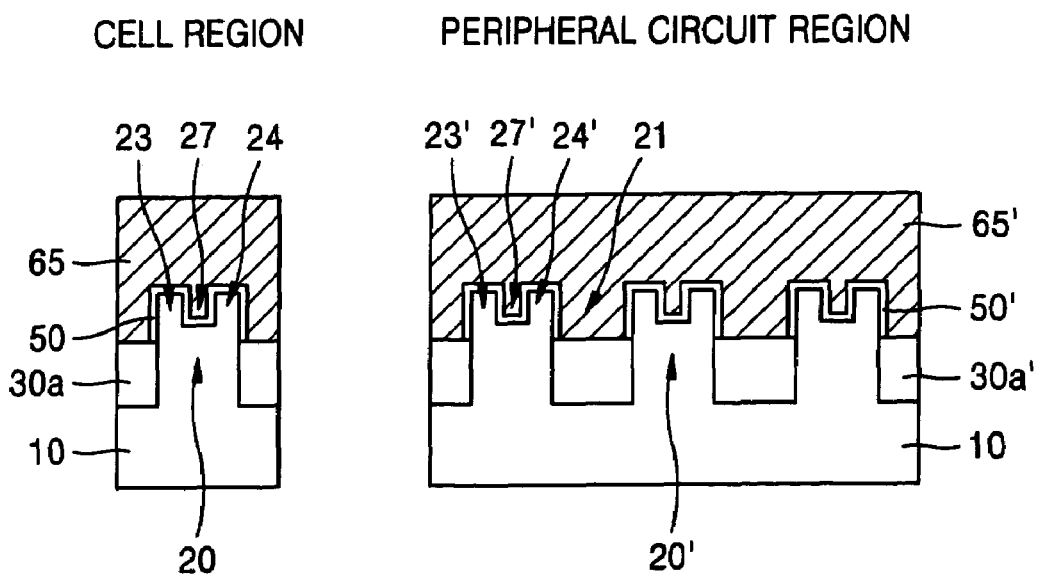

FIGS. 11A and 11B illustrate cross-sectional views, taken along the y-direction, of a semiconductor device in accordance with a second embodiment of the present invention and a semiconductor device in accordance with an alternative second embodiment of the present invention, respectively.

A method of fabricating a semiconductor device according to either the second or alternative second embodiment of the present invention is substantially similar to the method of fabricating a semiconductor device according to the first embodiment of the present invention. More specifically, the methods only differ with respect to the operation described above in connection with FIGS. 7 and 8. More specifically, when the operation described in connection with FIG. 7 is performed in the method of the second embodiment, the substrate 10 disposed under openings 45 and 45' is etched to a greater depth than in the first embodiment to define portions of the active regions 20 and 20' to be used as fin channels. Then, the second dielectric layer 40 and 40' and the first dielectric layer 30 and 30' are recessed as described with reference to FIG. 8, but they are recessed to a shallower depth than the channel depth. Subsequently, when the operation as described in connection with FIG. 9 is performed, a semiconductor device according to the second embodiment is obtained, a cross-sectional view of which is illustrated in FIG. 11A.

Referring to FIG. 11A, central trenches 25 and 25' are formed to a greater depth in the second embodiment than in the first embodiment, and the second dielectric layer 40 and 40' and the first dielectric layer 30 and 30' are recessed to a shallower depth than the channel depth. Resultantly, the upper surface of the active regions 20 and 20' between the first 23 and 23' and second 24 and 24' protruding portions is lower than the upper surface of the isolation region 30a and 30a' and the semiconductor substrate 10. In this embodiment, effective channel width can be maximized.

In an alternative second embodiment, as shown in FIG. 11B, the central trenches 27 and 27' may be formed to a shallower depth than in the first embodiment, and the second dielectric layer 40 and 40' and the first dielectric layer 30 and 30' are recessed to a deeper depth than the channel depth. Resultantly, the upper surface of the active regions 20 and 20' between the first 23 and 23' and second 24 and 24' protruding portions is higher than the upper surface of the isolation region 30a and 30a' and the semiconductor substrate 10.

Third Embodiment

Figure 12:
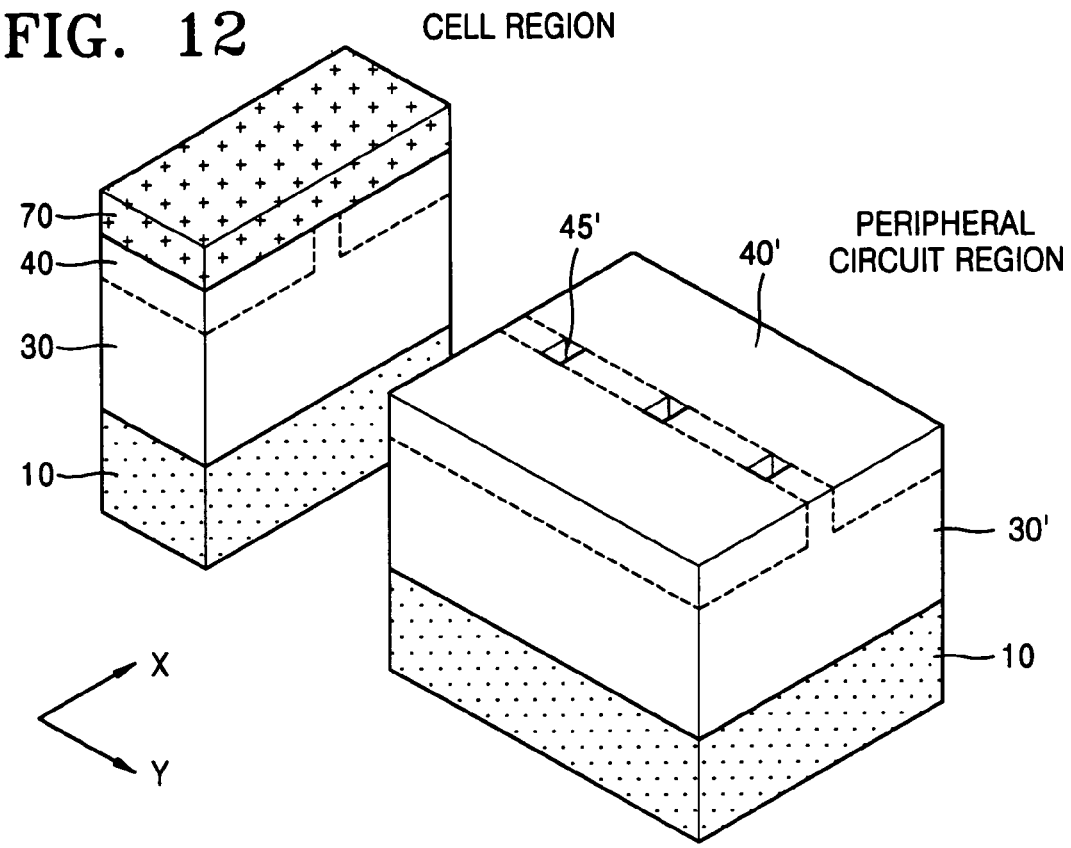
FIGS. 12 through 14 illustrate perspective views of stages in a method of fabricating a semiconductor device in accordance with a third embodiment of the present invention.
Figure 13:
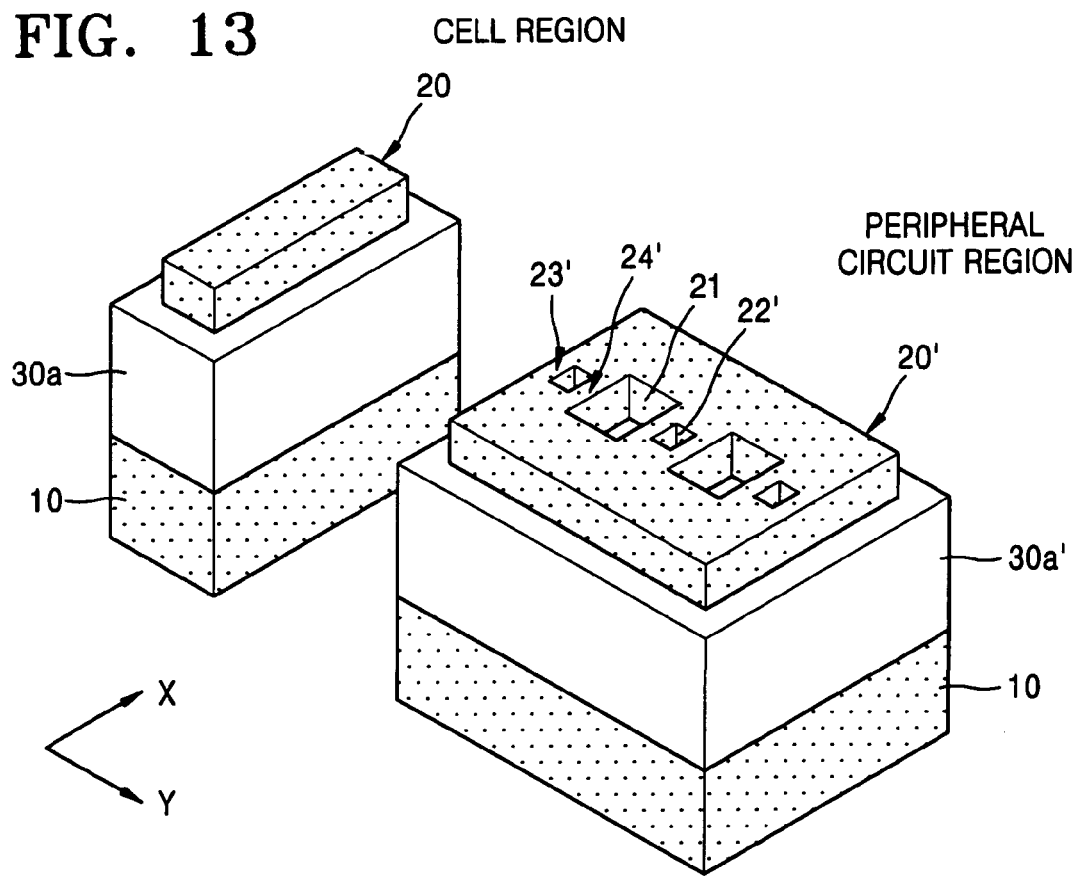
Figure 14:
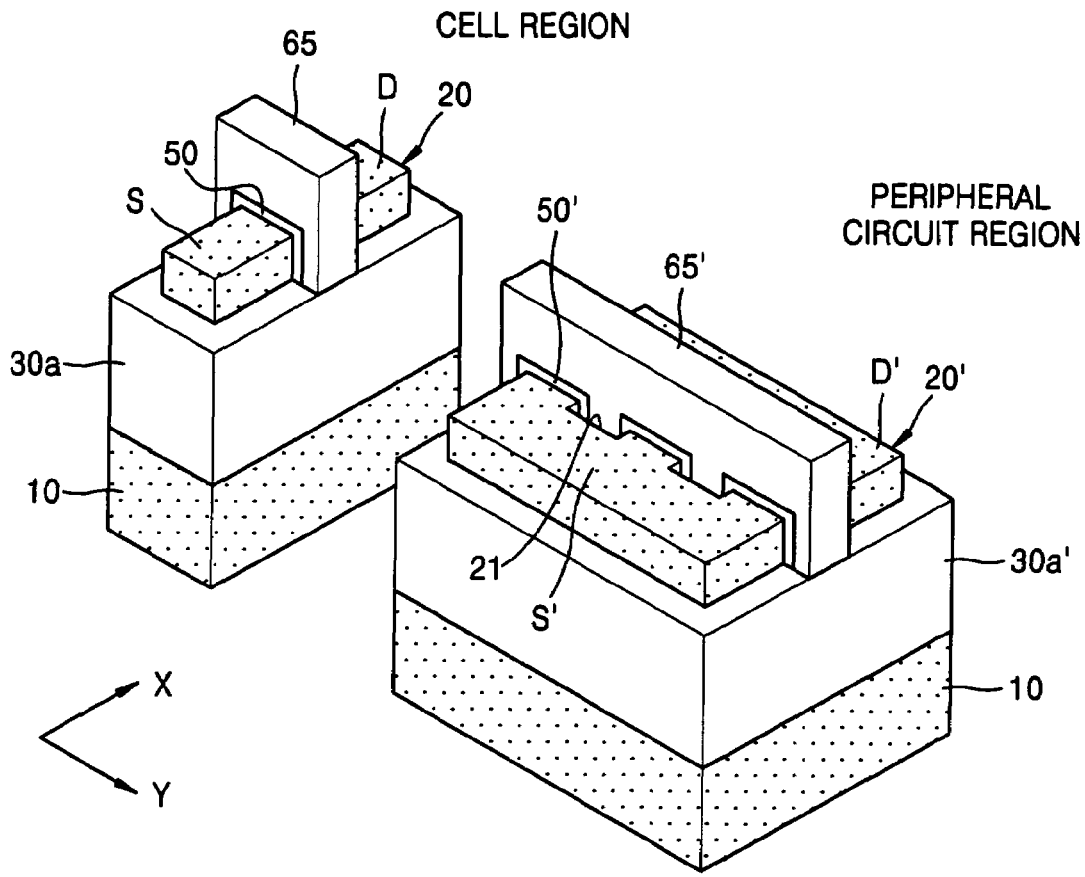
Figure 15:
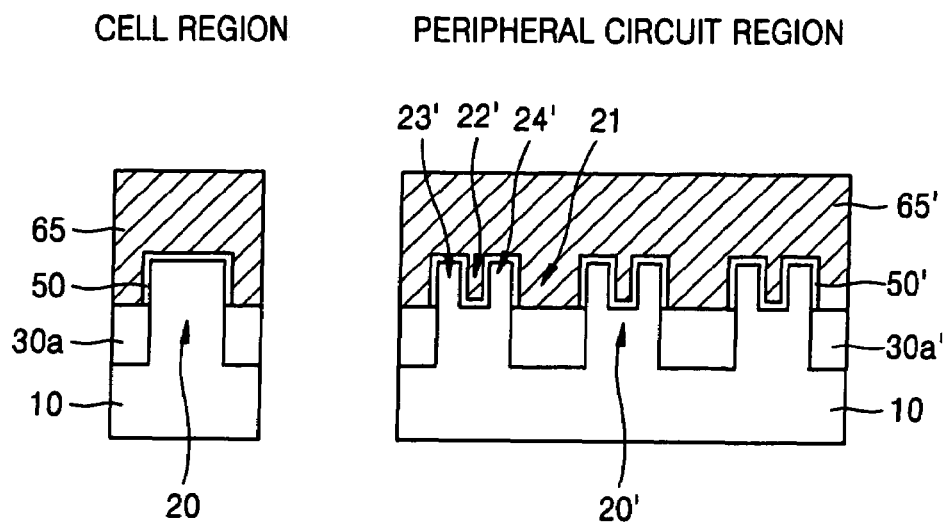
FIG. 15 illustrates a cross-sectional view, taken along the y-direction, of a semiconductor device according to the third embodiment of the present invention as shown in FIG. 14.

FIGS. 12 through 14 illustrate perspective views of stages in a method of fabricating a semiconductor device in accordance with a third embodiment of the present invention. FIG. 15 illustrates a cross-sectional view, taken along the y-direction, of a semiconductor device according to the third embodiment of the present invention as shown in FIG. 14.

In a semiconductor device according to the third embodiment of the present invention, while a plurality of multi-channel FinFETs is formed in the peripheral circuit region, just as in the first embodiment, a single channel FinFET is formed in the cell region.

In the method of the third embodiment, operations described in connection with FIGS. 2 through 6 of the first embodiment are the same. Accordingly, discussion of those operations will not be repeated in connection with the third embodiment.

Referring to FIG. 12, a mask 70, e.g., a photoresist, is deposited on the second dielectric layer 40 in the cell region. The mask 70 covers the channel defining pattern 15b in the cell region and allows the channel region defining patterns 15b' in the peripheral circuit region to remain exposed. Similar to the operation described in connection with FIG. 7 of the first embodiment, the exposed channel region defining patterns 15b' are selectively removed using dry or wet etching with respect to the second dielectric layer 40', the first dielectric layer 30', and the substrate 10. Resultantly, openings 45' are formed where the channel region defining patterns 15b' are removed, and upper surfaces of the active region 20' under the openings 45' are exposed. As compared to the first embodiment, the openings 45' are formed only in the peripheral circuit region. The active regions 20' under the openings 45' are then anisotropically etched using the second dielectric layer 40' and the first dielectric layer 30' as an etch mask to define portions to be used as fin channels. After the anisotropic etching, the remaining mask 70 is removed.

In the third embodiment, a channel ion implantation process may be performed either before or after the mask 70 is removed. Preferably, several ion implantation processes may be performed at different energies so that channel ions are uniformly distributed in the fin channels. For example, a first boron implantation may be performed at 30 keV, and then a second boron implantation may be performed at 15 keV. In this case, the ion implantation processes are performed perpendicularly to the substrate 10.

Referring to FIG. 13, the second dielectric layer 40 and 40' and the first dielectric layer 30 and 30' are recessed using an anisotropic etching to a same depth as a channel depth, thereby forming the isolation region 30a and 30a' around the exposed active regions 20 and 20'. Central trenches 22' around the fin channels are formed only in the active region 20' of the peripheral circuit region.

In the peripheral circuit region, first protrusions 23' and second protrusions 24', which are comprised of the surface of the substrate 10, are exposed between the central trenches 22' and the isolation region 30a'. Top surfaces and lateral surfaces of the first protrusions 23' and the second protrusions 24' form a three-dimensional active channel region. In addition, the top surface of the first protrusions 23' and top surfaces of the second protrusions 24' are respectively separated from each other by the central trenches 22'. The first protrusions 23' and the second protrusions 24' may be parallel. In addition, the first protrusions 23 and 23' and second protrusions 24 and 24' may have a width of about 30 nm or less.

As described in connection with the first embodiment, if the channel ion implantation process is omitted from the operation described in connection with FIG. 12, the channel ion implantation process can be performed after the operation described in connection with FIG. 13. Preferably, several ion implantation processes may be performed at different energies so that channel ions can be uniformly distributed in the fin channels. In this case, the ion implantation processes are obliquely performed.

Referring to FIG. 14, a gate dielectric layer 50 and 50' is formed on the active regions 20 and 20', respectively. Gate electrodes 65 and 65' are then formed in the cell region and the peripheral circuit region, respectively, to complete a semiconductor device in accordance with the third embodiment of the present invention.

FIG. 15 illustrates a cross-sectional view of a semiconductor device in accordance with the third embodiment of the present invention.

As shown in FIG. 15, the semiconductor device according to the third embodiment includes a single channel FinFET formed in the cell region and a plurality of multi-channel FinFETs, e.g., three, formed in a single active region 20' in the peripheral circuit region.

In the third embodiment, a depth of the channels 22' may be varied so that an upper surface of the active region 20' between the first 23' and second 24' protrusions in the active region 20' may be either higher or lower than the upper surface of the isolation region 30a' and the substrate, as in the second or alternative second embodiment.

Fourth Embodiment

Figure 16:
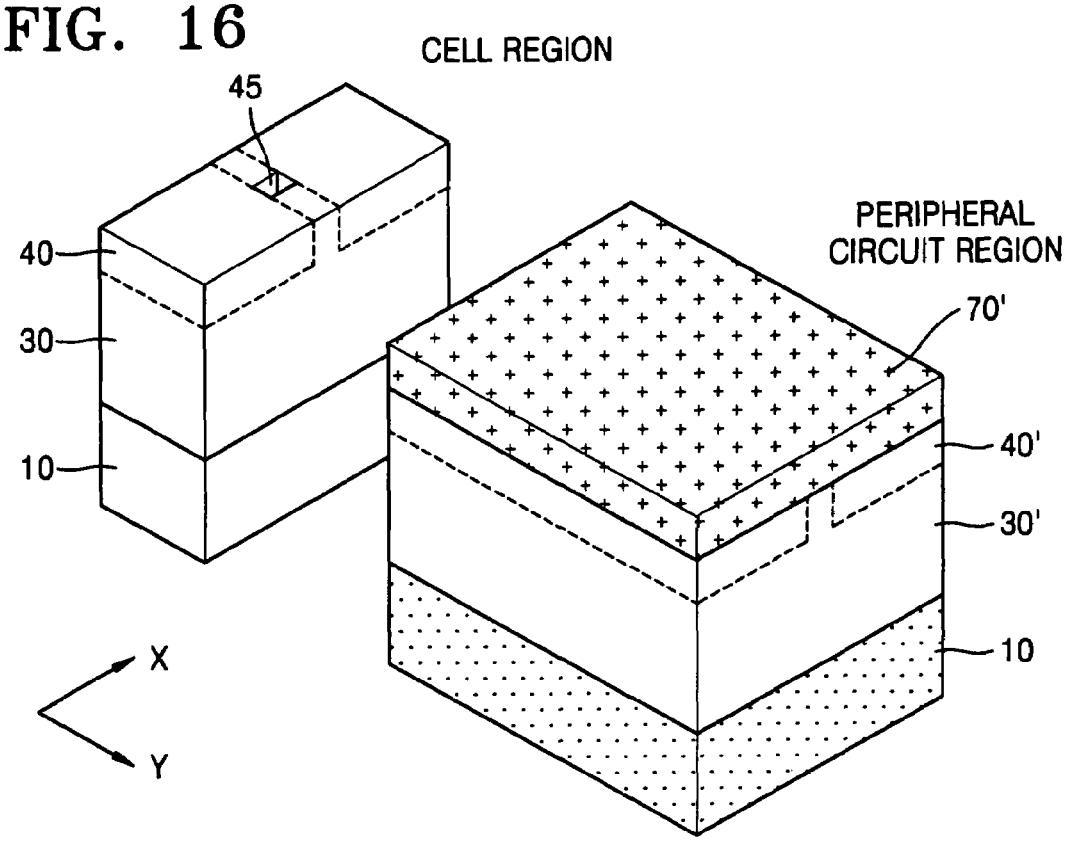
FIGS. 16 through 18 illustrate perspective views of stages in a method of fabricating a semiconductor device in accordance with a fourth embodiment of the present invention.
Figure 17:
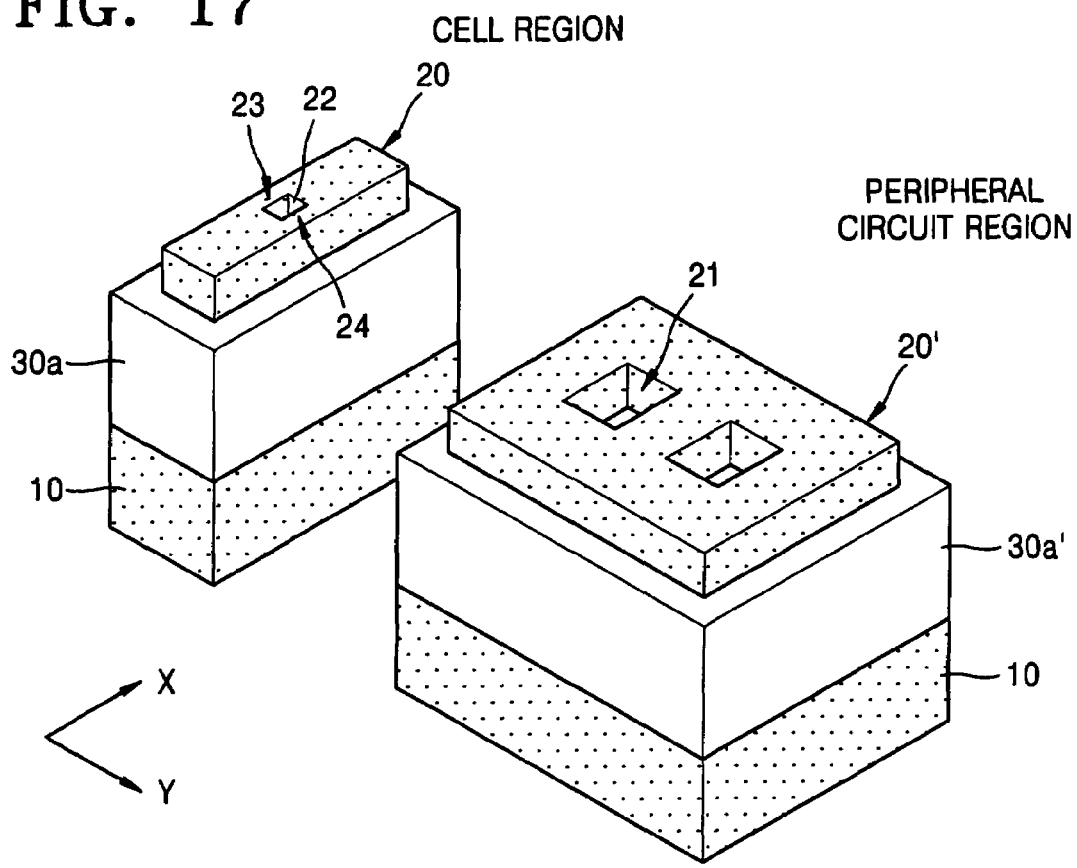
Figure 18:
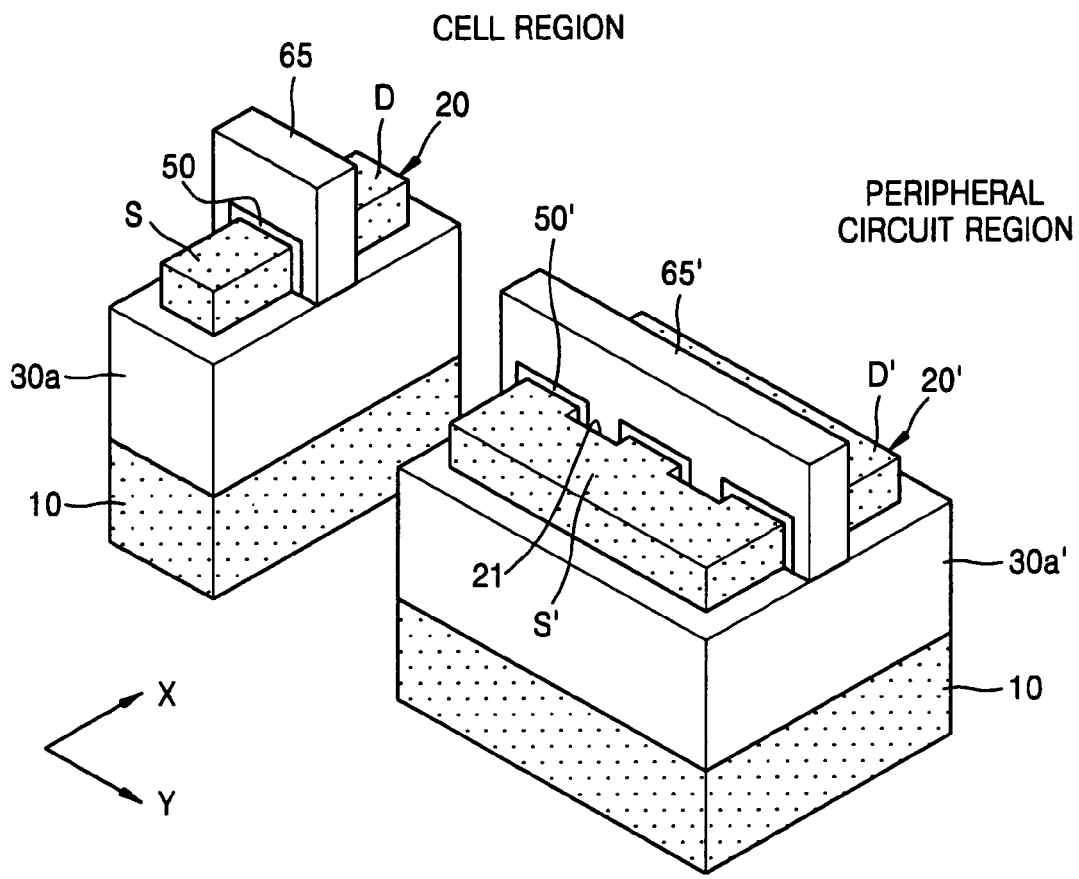
Figure 19:
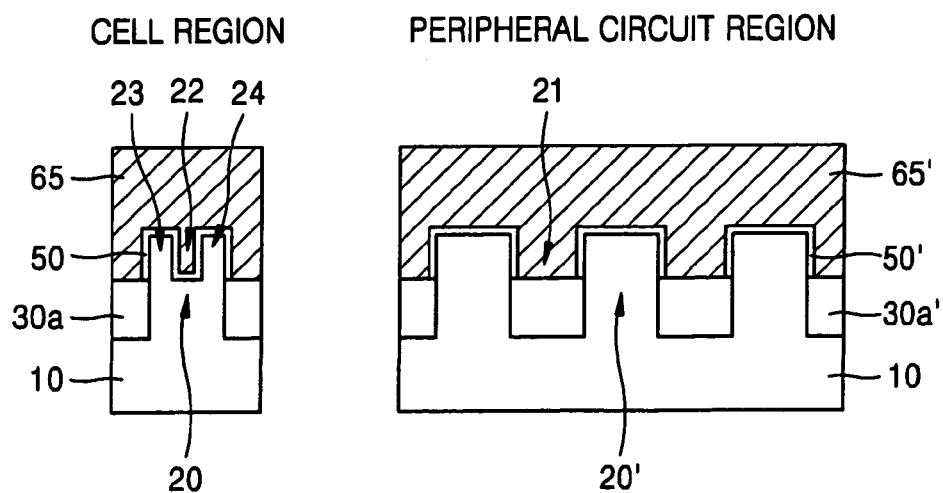
FIG. 19 illustrates a cross-sectional view, taken along the y-direction, of the semiconductor device according to the fourth embodiment of the present invention as shown in FIG. 18.

FIGS. 16 through 18 illustrate perspective views of stages in a method of fabricating a semiconductor device in accordance with a fourth embodiment of the present invention. FIG. 19 illustrates a cross-sectional view, taken along the y-direction, of the semiconductor device according to the fourth embodiment of the present invention as shown in FIG. 18.

In the semiconductor device according to the fourth embodiment of the present invention, while a multi-channel FinFET is formed in the cell region as in the first embodiment, a single channel FinFET is formed in the peripheral circuit region.

In the method of the fourth embodiment, operations described in connection with FIGS. 2 through 6 of the first embodiment are the same. Accordingly, discussion of those operations will not be repeated in connection with the fourth embodiment.

Referring to FIG. 16, a mask 70', e.g., a photoresist, is deposited on the second dielectric layer 40' in the peripheral circuit region. The mask 70' covers the channel defining pattern 15b' in the peripheral circuit region and allows the channel region defining pattern 15b in the cell region to remain exposed. Similar to the operation described in connection with FIG. 7 of the first embodiment, the exposed channel region defining pattern 15b is selectively removed using dry or wet etching with respect to the second dielectric layer 40, the first dielectric layer 30, and the substrate 10. Resultantly, opening 45 is formed where the channel region defining pattern 15b is removed, and an upper surface of the active region 20 under the openings 45 is exposed. As compared to the first embodiment, the opening 45 is formed only in the cell region. The active region 20 under the opening 45 is then anisotropically etched using the second dielectric layer 40 and the first dielectric layer 30 as an etch mask to define portions to be used as fin channels. After the anisotropic etching, the remaining mask 70' is removed.

In the fourth embodiment, a channel ion implantation process may be performed either before or after the mask 70' is removed. Preferably, several ion implantation processes may be performed at different energies, so that channel ions are uniformly distributed in the fin channels. For example, a first boron implantation may be performed at 30 keV, and then a second boron implantation may be performed at 15 keV. In this case, the ion implantation processes are performed perpendicularly to the substrate 10.

Referring to FIG. 17, the second dielectric layer 40 and 40' and the third dielectric layer 30 and 30' are recessed using an anisotropic etching to a same depth as a channel depth, thereby forming the isolation region 30a and 30a' around the exposed active regions 20 and 20'. A central trench 22 around the fin channels is formed only in the active region 20 of the cell region.

In the cell region, first protrusion 23 and second protrusion 24, which are comprised of the surface of the substrate 10, are exposed between the central trench 22 and the isolation region 30a. Top surfaces and lateral surfaces of the first protrusion 23 and the second protrusion 24 form a three-dimensional channel region. In addition, the top surface of the first protrusion 23 and the top surface of the second protrusion 24 are respectively separated from each other by the central trench 22. The first protrusion 23 and the second protrusion 24 may be parallel.

As described in connection with the first embodiment, if the channel ion implantation process is omitted from the operation described in connection with FIG. 16, the channel ion implantation process can be performed after the operation described in connection with FIG. 17. Preferably, several ion implantation processes may be performed at different energies so that channel ions can be uniformly distributed in the fin channels. In this case, the ion implantation processes are obliquely performed.

Referring to FIG. 18, a gate dielectric layer 50 and 50' is formed on the active regions 20 and 20', respectively. Gate electrodes 65 and 65' are then formed in the cell region and the peripheral circuit region, respectively, to complete a semiconductor device in accordance with the fourth embodiment of the present invention.

FIG. 19 illustrates a cross-sectional view, taken along the y-direction, of the semiconductor device in accordance with the fourth embodiment of the present invention.

As shown in FIG. 19, the semiconductor device according to the fourth embodiment includes a multi-channel FinFET formed in the cell region and a plurality of single channel FinFETs, e.g., three, formed in a single active region 20' in the peripheral circuit region.

As described in connection with the third embodiment, in the fourth embodiment, a depth of the channel 22 may be varied so that an upper surface of the active region 20 between the first 23 and second 24 protrusions in the active region 20 may be either higher or lower than the upper surface of the isolation region 30a and the substrate 10, as in the second or alternative second embodiment.

Fifth and Sixth Embodiments

Figure 20:
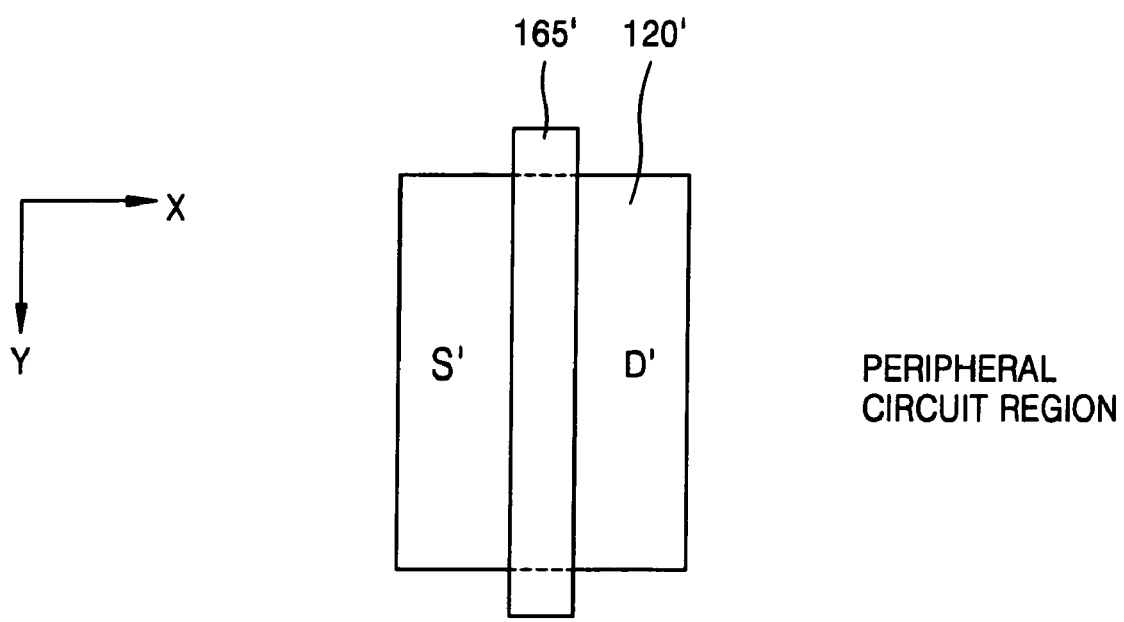
FIG. 20 illustrates a plan view of a semiconductor device formed by a method of fabricating a semiconductor device according to a fifth and a sixth embodiment of the present invention.

FIG. 20 illustrates a plan view of a semiconductor device formed by a method of fabricating a semiconductor device according to a fifth and a sixth embodiment of the present invention.

Referring to FIG. 20, the semiconductor device is divided into a cell region and a peripheral circuit region. The cell region includes an active region 120 and a gate electrode 165. The active region 120 and the gate electrode 165, which is formed on the active region 120, are perpendicular relative to one another. For example, a length of the active region 120 may extend in an x-direction and a length of the gate electrode 165 may extend in a y-direction. The active region 120 includes a source S and a drain D formed on either side of the gate electrode 165.

The peripheral circuit region includes an active region 120' and a gate electrode 165', which is formed on the active region 120'. The active region 120' and the gate electrode 165' are both substantially rectangular in shape. A length of the gate electrode 165', e.g., which may extend in the y-direction, is larger than a length of the active region 120', which may similarly extend in the y-direction. A width of the gate electrode 165', e.g., which may extend in the x-direction, however, is smaller than a width of the active region 120', which may similarly extend in the x-direction. The length of the active region 120', i.e., in the y-direction, in the peripheral circuit region may be five times the width of the active region 120, i.e., in the y-direction, in the cell region. When the width of the active region 120' in the peripheral circuit region, i.e., in the x-direction, is equal to the length of the active region 120 in the cell region, i.e., also in the x-direction, an area of the active region 120' in the peripheral circuit region is greater than that of the active region 120 in the cell region. The active region 120' includes a source S' and a drain D' formed on either side of the gate electrode 165'.

As shown in FIG. 20, contact regions formed in the sources of the cell region and the peripheral circuit region S and S', respectively, and the drains of the cell region and the peripheral circuit region D and D', respectively, are larger in a width direction of the gate electrodes 165 and 165' than the gate electrodes 165 and 165'. Accordingly, the present invention is able to reduce problems caused by a conventional patterning process and provide sufficient contact regions of the source/drain.

Fifth Embodiment

FIGS. 21 through 30 illustrate perspective views of stages in a method of fabricating a semiconductor device in accordance with a fifth embodiment of the present invention. In FIGS. 21-24, a portion of a primary isolation region 116 and 116' is cut-away to allow illustration of active regions 120 and 120' and hard mask layers 115 and 115'.

Figure 21:
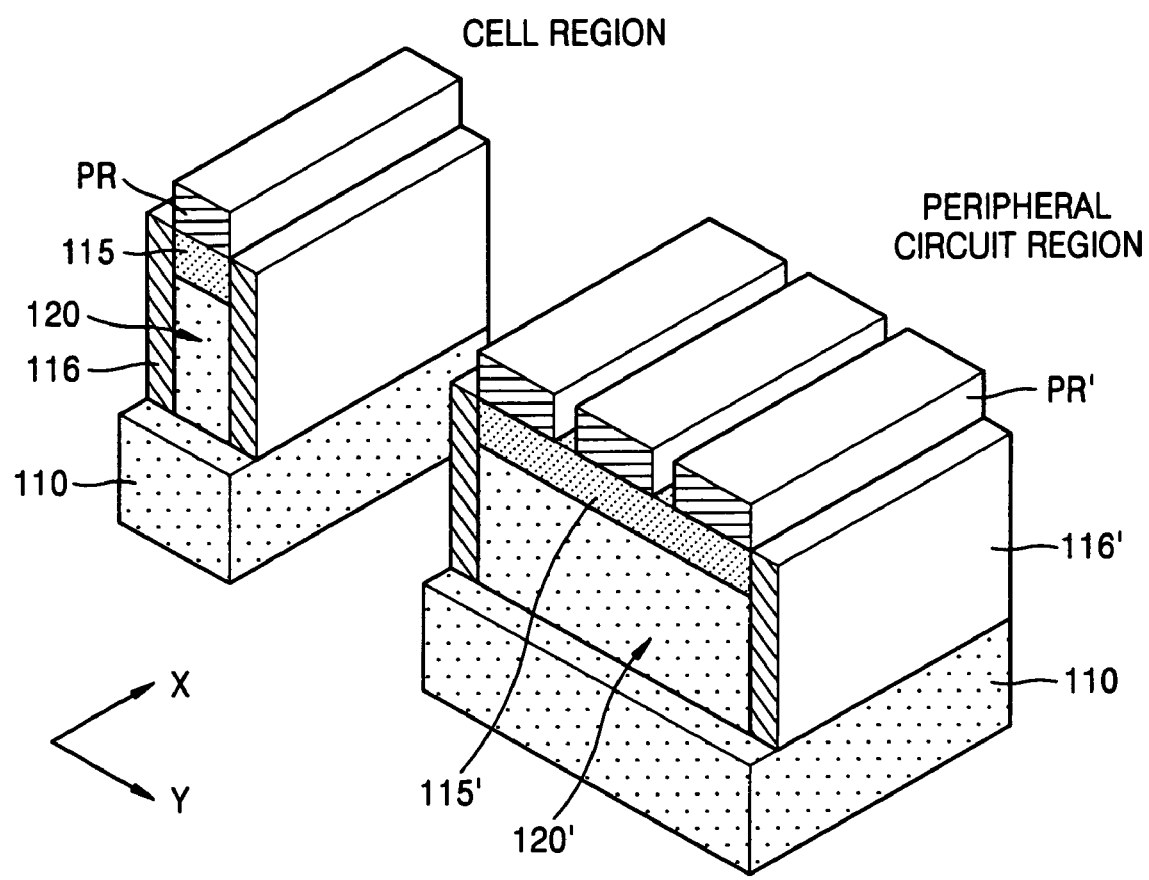

Referring to FIG. 21, hard mask layers 115 and 115' are deposited on a semiconductor substrate 110, e.g., a bulk silicon wafer. Subsequently, the hard mask layers 115 and 115' will be patterned to define active regions 120 and 120' in the cell region and the peripheral circuit region, respectively, of the semiconductor substrate 110. Prior to depositing the hard mask layers 115 and 115', a buffer layer, e.g., a thermal oxide layer, may be deposited on the semiconductor substrate to reduce stress between the hard mask layers 115 and 115' and the substrate 110.

Subsequently, an insulating material is deposited to surround the active regions 120 and 120' and planarized, e.g., using CMP, until the hard mask layers 115 and 115' are exposed, thereby forming a primary isolation region (not shown).

An active region photo option mask PR and PR' is then formed on the hard mask layers 115 and 115'. While the photo option mask PR covers and protects the entire cell region, the photo option mask PR' is formed as a line and space type on the active region 120' of the peripheral circuit region. Widths of the lines and spaces, i.e., in the y-direction, may be appropriately determined depending on a width of the fins.

Figure 22:
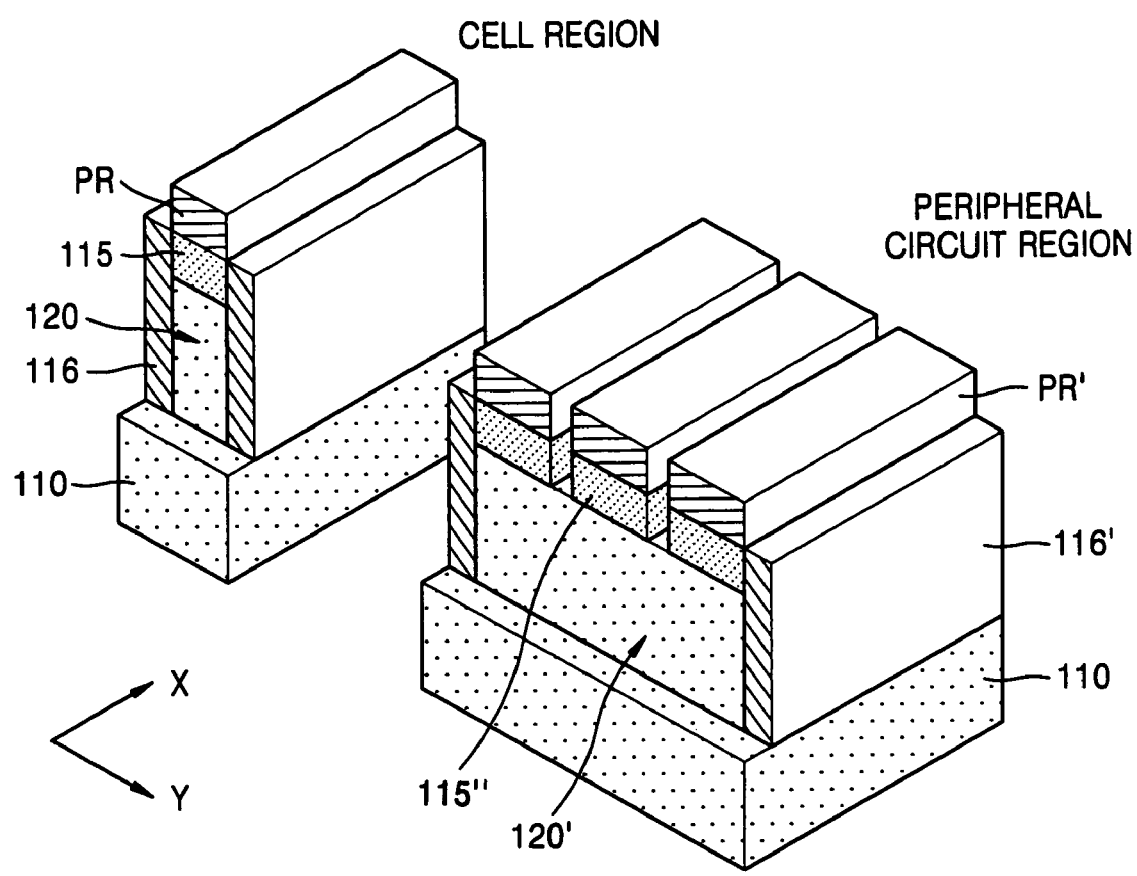

Referring to FIG. 22, the hard mask layer 115' of the peripheral circuit region is anisotropically etched using the photo option mask PR' as an etch mask, thereby forming a line-and-space-type hard mask pattern 115" in the peripheral circuit region. In this operation, the hard mask layer 115' is selectively etched with respect to the primary isolation region (not shown) and the substrate 110. The active region photo option mask PR and PR' is then removed.

Figure 23:
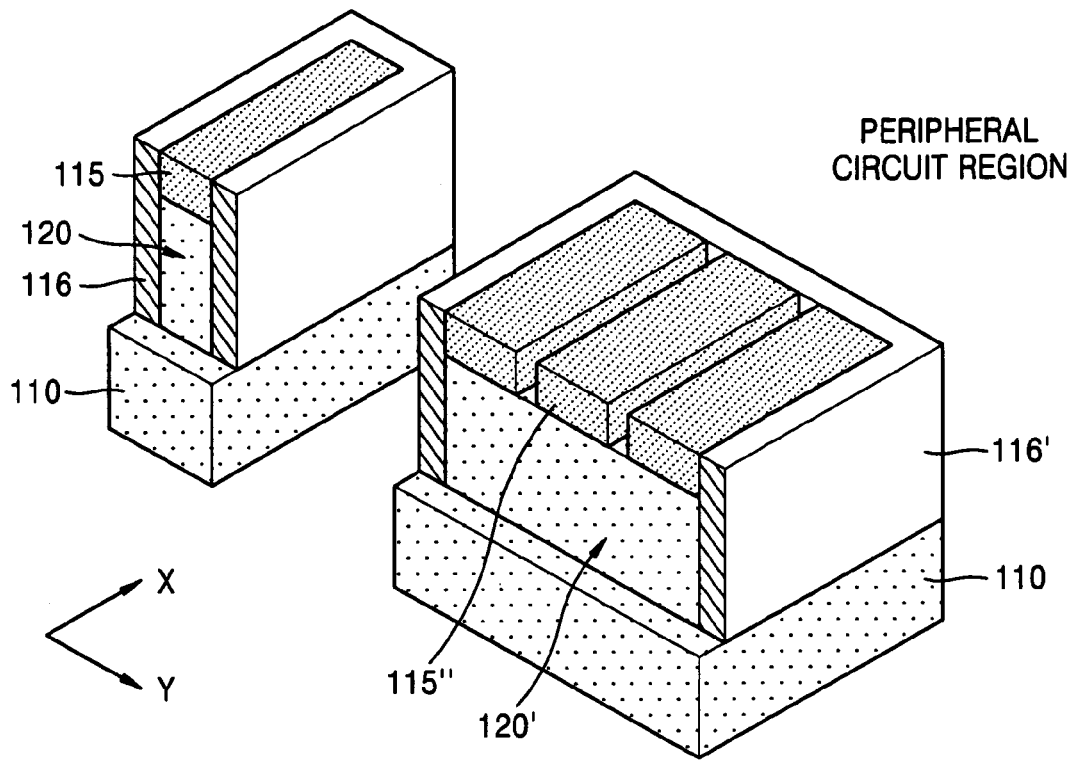

Referring to FIG. 23, after the removal of the active region photo option mask PR and PR', subsequent operations are substantially similar to operations described in connection with the first embodiment.

Figure 24:
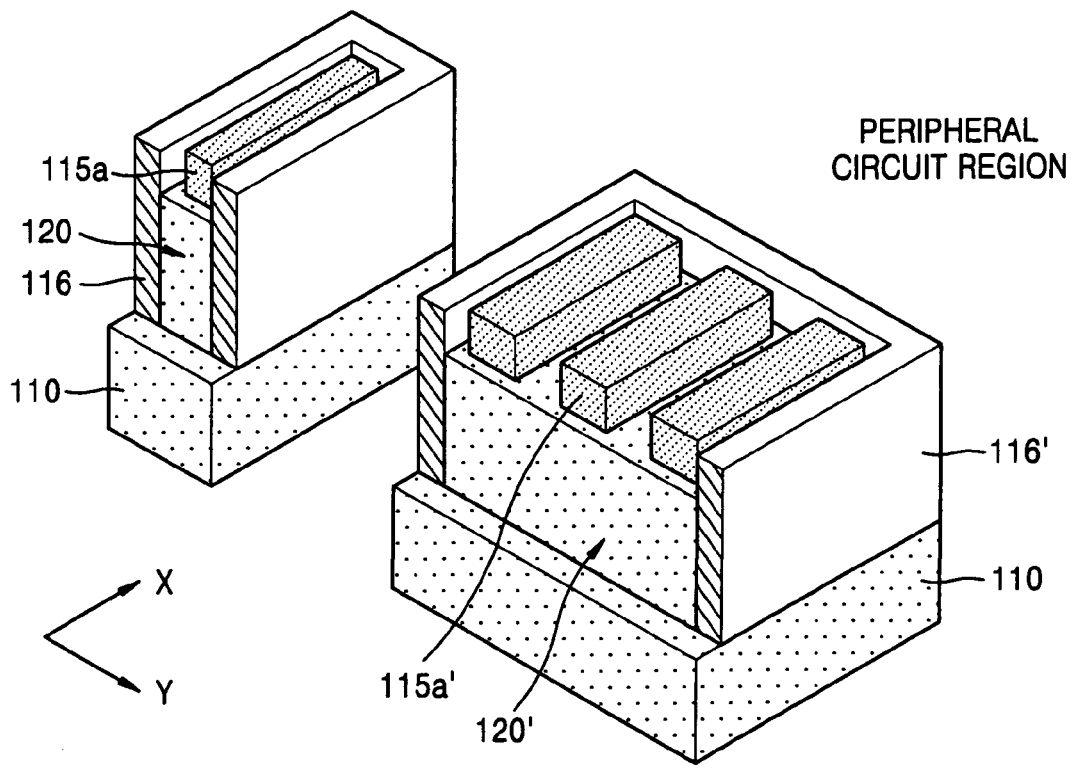

Referring to FIG. 24, the hard mask layer 115 and the line-and-space-type hard mask pattern 115" are isotropically etched to form hard mask patterns 115a and 115a'. The isotropic etching of the hard mask layer 115 and the line-and-space-type hard mask pattern 115" narrows the hard mask layer 115 and the line-and-space-type hard mask pattern 115", and portions of an upper surface of the active regions 120 and 120' are exposed. As described in the first embodiment, because as the widths, i.e., in the y-direction, of the hard mask patterns 115a and 115a' decrease, the width of a fin to be formed later increases, the width of the fin can be controlled by appropriately adjusting a time that the isotropic etching is performed.

Figure 25:
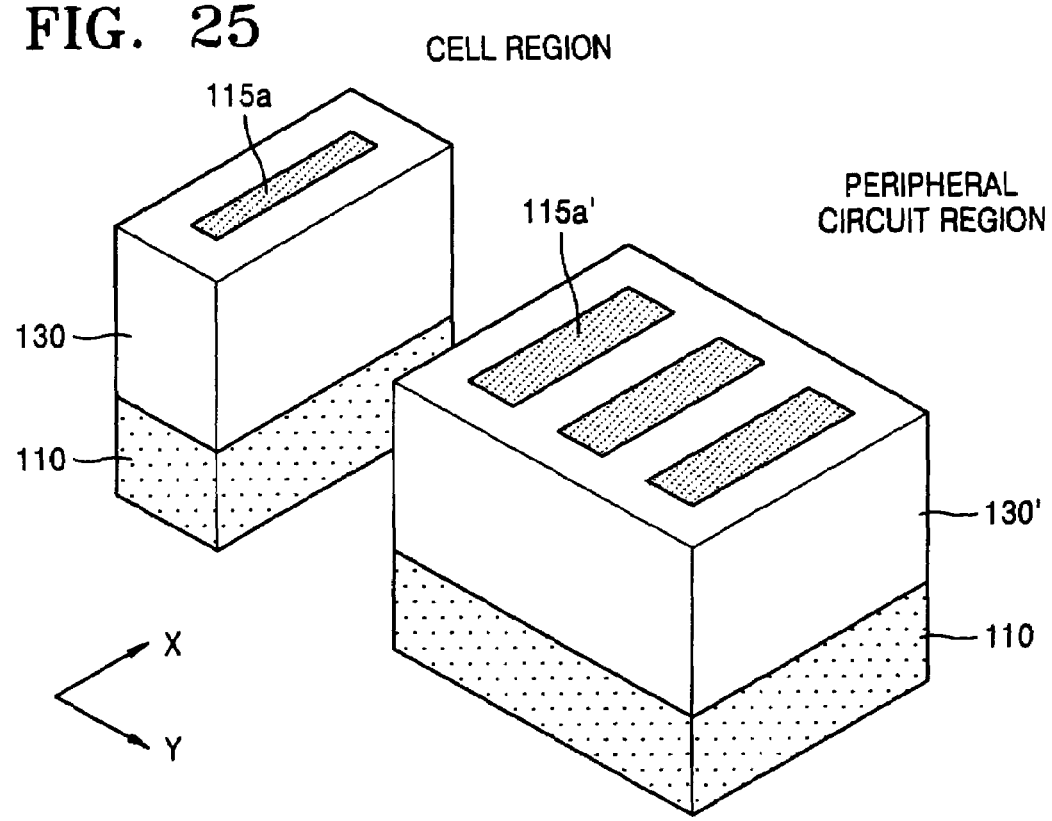

Referring to FIG. 25, a first dielectric layer 130 and 130', e.g., an insulating material such as an oxide, is deposited to cover the hard mask patterns 115a and 115a' and to surround the active regions 120 and 120'. The first dielectric layer 130 and 130' is then planarized, e.g., using CMP, until an upper surface of the hard mask patterns 115a and 115a' is exposed. Hereinafter, the primary isolation region formed in the operation described in connection with FIG. 21 and the first dielectric layer 130 and 130' will be illustrated and referred to as a gap filling dielectric layer 130 and 130'.

Figure 26:
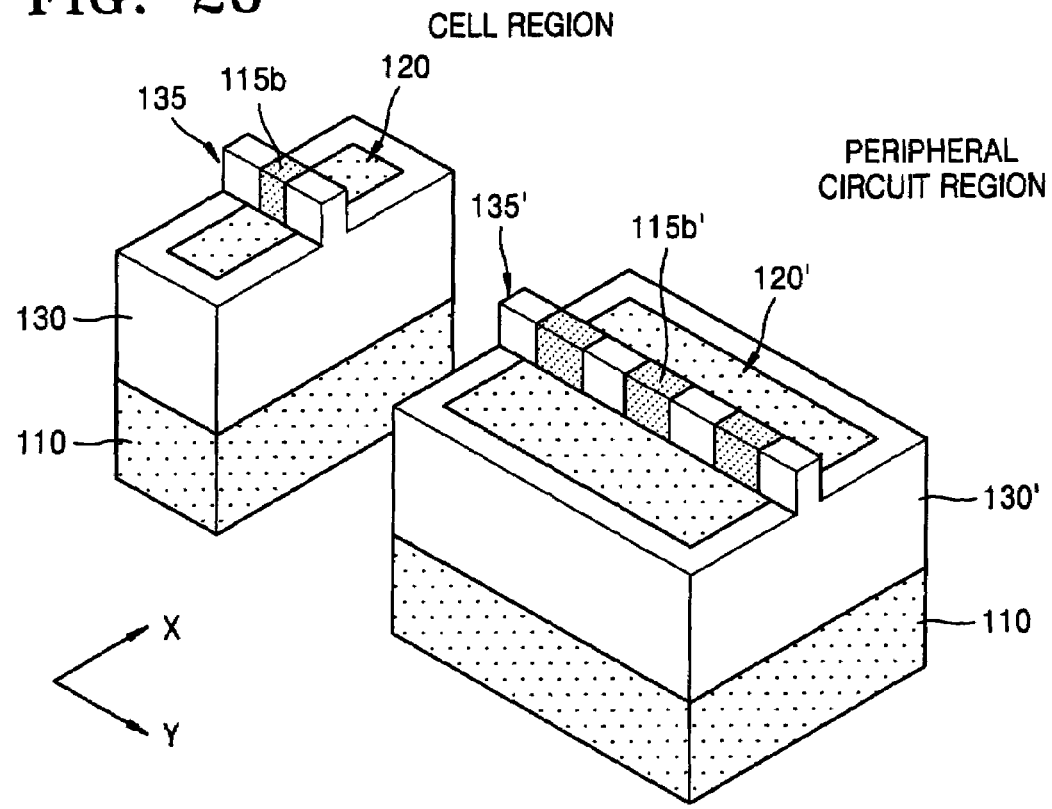

Referring to FIG. 26, the gap filling dielectric layer 130 and 130' and the hard mask patterns 115a and 115a' are patterned to form dummy gate patterns 135 and 135' in the cell region and the peripheral circuit region, respectively. The dummy gate patterns 135 and 135' are formed where gate electrodes 165 and 165' of FIG. 20 will be subsequently formed, i.e., to extend in the y-direction.

During the formation of the dummy gate patterns 135 and 135', most of the hard mask patterns 115a and 115a' are removed. Resultantly, a single channel region defining pattern 115b is formed in a center of the cell region and a plurality of channel region defining regions 115b' are formed in the peripheral circuit region. The plurality of channel region defining patterns 115b' extends in the y-direction through a center of the peripheral circuit region. Portions of an upper surface of the active regions 120 and 120', which are disposed under the dummy gate patterns 135 and 135', respectively, are exposed by the formation of the dummy gate patterns 135 and 135'.

Figure 27:
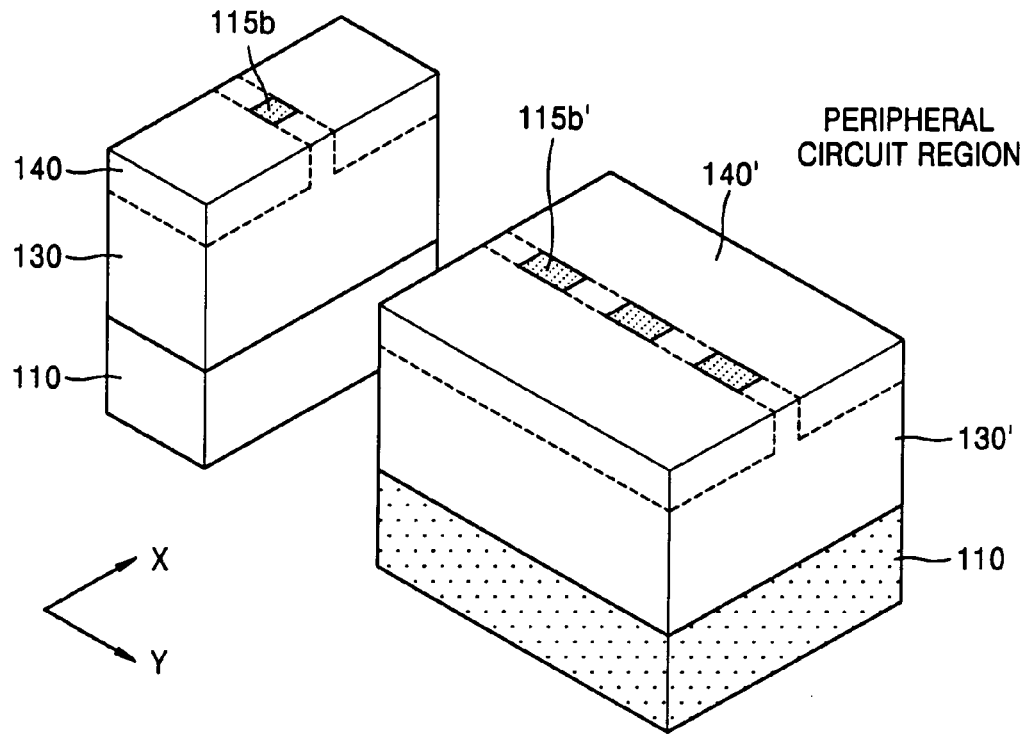

Referring to FIG. 27, a second dielectric layer 140 and 140', e.g., an oxide layer, is deposited on the dummy gate patterns 135 and 135'. The second dielectric layer 140 and 140' is then planarized until an upper surface of the channel region defining patterns 115b and 115b' is exposed. Because the second dielectric layer 140 and 140' and the gap filling dielectric layer 130 and 130' may be similar or identical oxide layers, there may not be a distinct interface therebetween. In any event, the second dielectric layer 140 and 140' and the gap filling dielectric layer 130 and 130' are shown as distinct layers using dotted lines in the figures.

Figure 28:
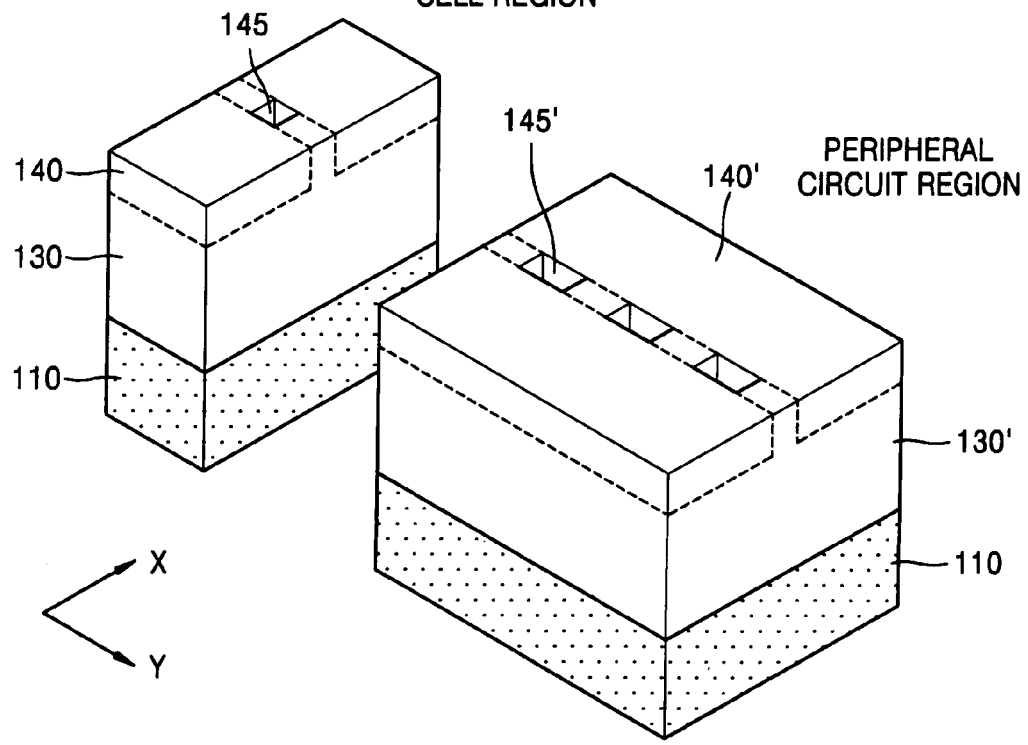

Referring to FIG. 28, the channel region defining patterns 115b and 115b', which were exposed by the planarization process as described in connection with FIG. 27, are selectively removed using wet or dry etching with respect to the second dielectric layer 140 and 140', the gap filling oxide layer 130 and 130', and the substrate 110. Resultantly, openings 145 and 145' are formed where the channel region defining regions 115b and 115b' are removed, and upper surfaces of the active regions 120 and 120' under the openings 145 and 145' are exposed. The active regions 120 and 120' under the openings 145 and 145' are then anisotropically etched using the second dielectric layer 140 and 140' and the gap filling dielectric layer 130 and 130' as an etch mask to define portions to be used as fin channels.

As described above, the width of the fin in the cell region is the difference between the width of the active region 120 and the width of the hard mask pattern 115a. The width of the fin in the peripheral circuit region is similarly defined.

As in the first through fourth embodiments, a channel ion implantation process may be performed on the exposed active regions 120 and 120'. Preferably, several channel ion implantation processes may be performed at different energies such that channel ions are uniformly distributed in fin channels. For example, a first boron implantation may be performed at 30 keV, and then a second boron implantation may be performed at 15 keV. The ion implantation processes may be performed perpendicularly to the substrate 110.

Referring to FIG. 29, the second dielectric layer 140 and 140' and the gap filling oxide layer 130 and 130' are recessed using an anisotropic etching to a same depth as a channel depth. Resultantly, a secondary isolation region 130a and 130a' is formed around the exposed active regions 120 and 120'. In addition, central trenches 122 and 122' are formed in the fin channels of the active regions 120 and 120', respectively, by etching the active regions 120 and 120' through the openings 145 and 145' as described in connection with FIG. 28.

As a result, first protrusions 123 and 123' and a second protrusion 124, which are comprised of the surface of the substrate 110, in the active regions 120 and 120', are exposed between the central trenches 122 and 122' and the secondary isolation region 130a and 130a'. Top surfaces and lateral surfaces of the first protrusions 123 and 123' and the second protrusion 124 form three-dimensional channel regions. In the cell region, the first protrusion 123 and the second protrusion 124 are separated from each other by the central trench 122. In the peripheral circuit region, each of the plurality of first protrusions 123' are separated by one of the central trenches 122'. In the cell region, the first protrusion 123 and the second protrusion 124 may be parallel. In the peripheral circuit region, each of the first protrusions 123' may be parallel to one another. In addition, the first protrusions 123 and 123' and second protrusions 124 and 124' may have a width of about 30 nm or less. Thus, a multi-channel FinFET is formed in the cell region and a plurality of single channel FinFETs is formed in the peripheral circuit region. The plurality of single channel FinFETs in the peripheral circuit region extends in the y-direction.

As an alternative to the above-described method, the channel ion implantation process, which was described as being performed after forming the openings 145 and 145' in connection with FIG. 28 above, may instead be performed after the fins are exposed as described in connection with FIG. 29. As described above, several ion implantation processes may be performed at different energies so that channel ions can be uniformly distributed in the fin channels. In this case, the ion implantation processes are obliquely performed.

In the method according to the fifth embodiment, it is relatively easy to form a plurality of first protrusions 123', i.e., active channels, having uniform widths in the peripheral circuit region using the line-and-space-type hard mask pattern 115'. Since a problem of nonuniformity of widths of the active channels, which is caused by a conventional patterning process, is solved, a current dispersion characteristic can be improved, and a threshold voltage in the peripheral circuit region may be controlled relatively easily. As long as a simple line-and-space-type photoresist pattern can be formed, the above-described process can be performed. Thus, a photolithography margin can be improved. As a further result, the present invention may be applied to logic devices in addition to memory devices.

Referring to FIG. 30, a gate dielectric layer 150 and 150', e.g., a gate oxide layer, is formed on the active regions 120 and 120' and the secondary isolation region 130a and 130a'. A gate conductive layer (not shown) is then formed on the gate dielectric layer 150 and 150' and patterned to form gate electrodes 165 and 165' in the cell region and the peripheral circuit region, respectively. The gate electrodes 165 and 165' may be formed to have the same width of the central trenches 122 and 122', respectively, and to cover the top surfaces and lateral surfaces of the first protrusions 123 and 123' and the second protrusions 124 and 124', i.e., channel regions, across the channel regions, respectively.

Subsequently, impurity ions are implanted to form source and drain regions and are thermally treated. Thus, a source S and a drain D are formed in the active region 120 on either side of the gate electrode 165 in the cell region, and a source S' and a drain D' are formed in the active region 120' on either side of the gate electrode 165' in the peripheral circuit region.

FIG. 31 illustrates a cross-sectional view, taken along the y-direction, of a semiconductor device according to the fifth embodiment of the present invention as shown in FIG. 30.

As can be seen from FIG. 31, a multi-channel FinFET is formed in an active region 120 of the cell region, as in the first embodiment, and a plurality of single channel FinFETs is formed in the active region 120' of the peripheral circuit 120' region. As compared to the device according to the fourth embodiment shown in FIG. 19, which similarly includes a plurality of single channel FinFETs formed in the peripheral circuit region, the device according to the fifth embodiment of the present invention omits the isolation regions 30a' of FIG. 19 from between each of the plurality of single channel FinFETs. The structure of the fifth embodiment may be referred to as a multi FinFET.

By appropriately controlling the widths, i.e., in the y-direction, of the lines and spaces of the active region photo option mask PR', the first protrusions 123' formed in the peripheral circuit region can be formed having a uniform width.

The semiconductor device according to the fifth embodiment includes the semiconductor substrate 110 having the cell region and the peripheral circuit region. The active region 120 of the cell region includes a pair of active channels protruding above an upper surface of the semiconductor substrate 110 and the isolation region 130a. The active region 120' of the peripheral circuit region includes a plurality of active channels protruding above an upper surface of the semiconductor substrate 110 and the isolation region 130a'. The active region 120 of the cell region includes a multi-channel FinFET formed of the first protrusion 123 and the second protrusion 124 and uses the top surfaces and lateral surfaces of the first and second protrusions 123 and 124 as active channel regions. Here, the first and second protrusions 123 and 124 are comprised of the surface of the cell region active region 120, separated by the central trench 122. The first and second protrusions 123 and 124 may be parallel to each other. The active region 120' of the peripheral circuit region includes a plurality of first protrusions 123' separated by one of a plurality of central trenches 122'. The gate dielectric layer 150 and 150' and the gate electrodes 165 and 165' are formed on the active regions 120 and 120' and the isolation regions 130a and 130a'. The sources S and S' and the drains D and D' are formed in the active regions 120 and 120' on either side of the gate electrodes 165 and 165'.

The gate electrodes 165 and 165' are formed to the same widths of the central trenches 122 and 122', respectively, and cover the top surfaces and lateral surfaces of the channel regions across the channel regions. The isolation region 130a is formed around the active regions 120 and 120' on the same level with the bottoms of the central trenches 122 and 122', as in the first embodiment.

In the above-described fifth embodiment, a multi-channel FinFET having two fins, i.e., protruding active channels, is formed in the cell region and an active region photo option mask. Simultaneously, a plurality of single channel FinFETs is formed in the peripheral circuit region. Thus, a channel area of a transistor increases to improve the operating speed of the transistor. Further, uniform rectangular active channels can be formed in the cell region and the peripheral circuit region at the same time. As a result, a device having a good current characteristic can be applied to logic devices in addition to memory devices.

In addition, in the fifth embodiment of the present invention, if an active region is formed in a single line shape in the peripheral circuit region, as is formed in the cell region, a transistor of the peripheral circuit region may also include a multi-channel FinFET, and thus, the active region option photo mask may be omitted. However, in the case of a DRAM, an overlap margin between the active region and a bit line contact should be considered.

Sixth Embodiment

Figure 38:
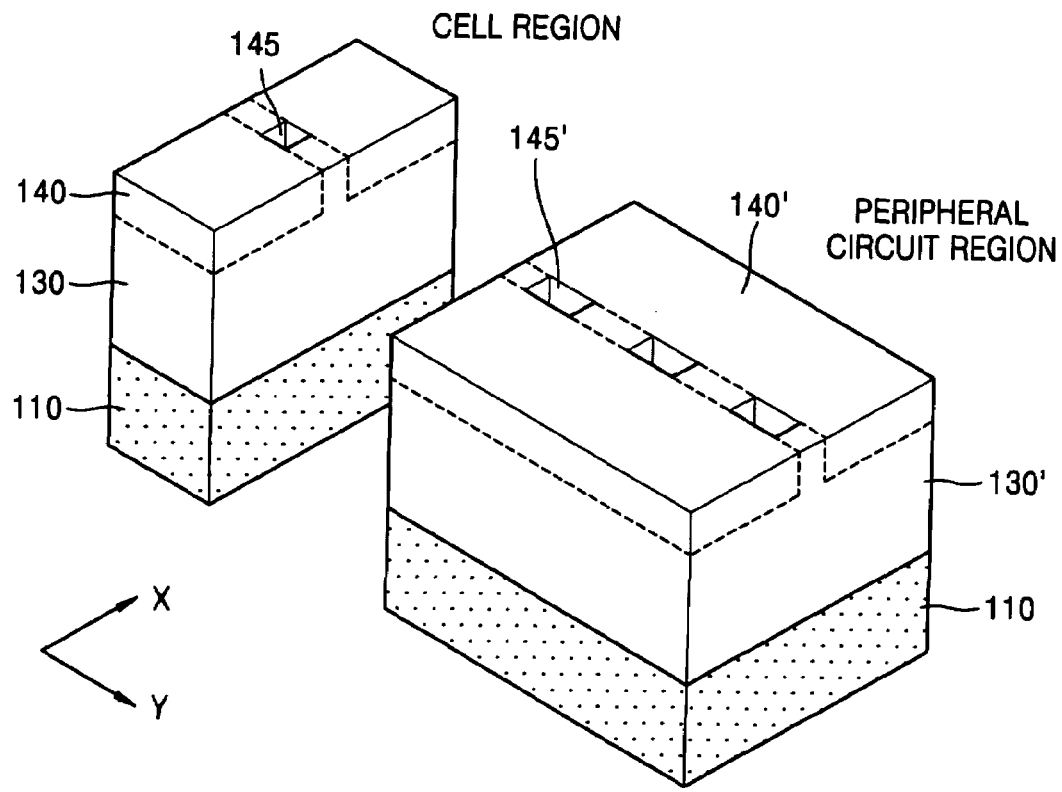
Figure 39:
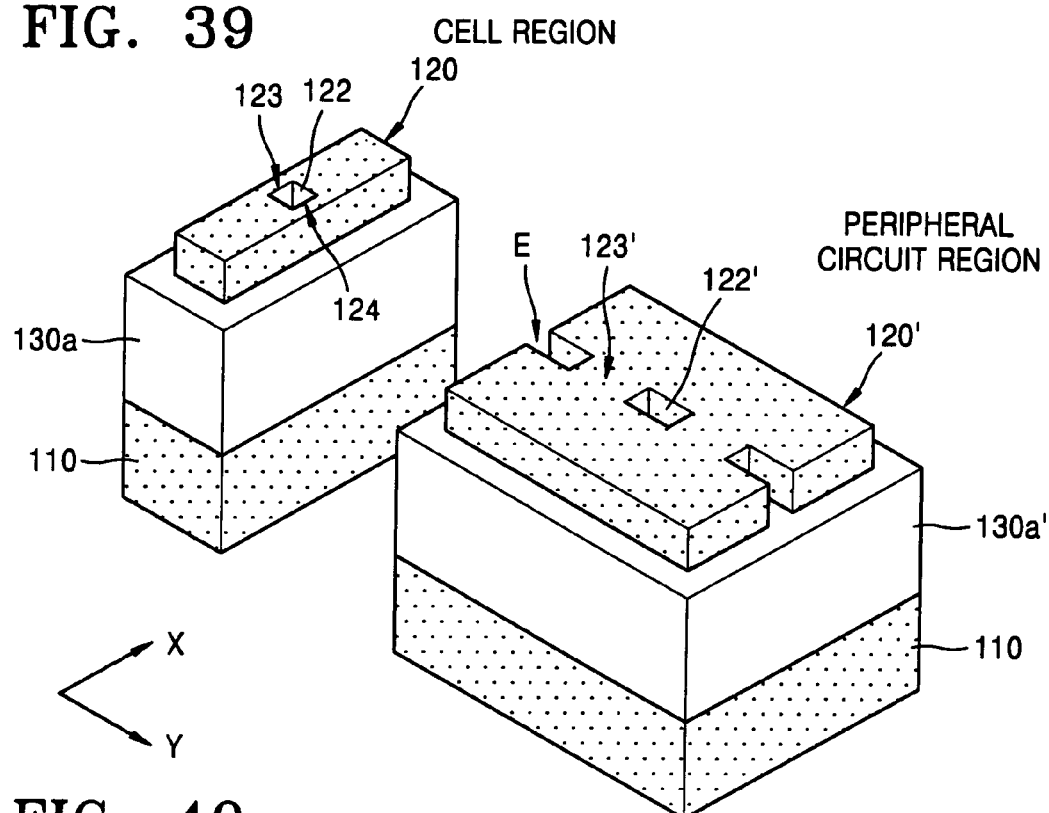
Figure 40:
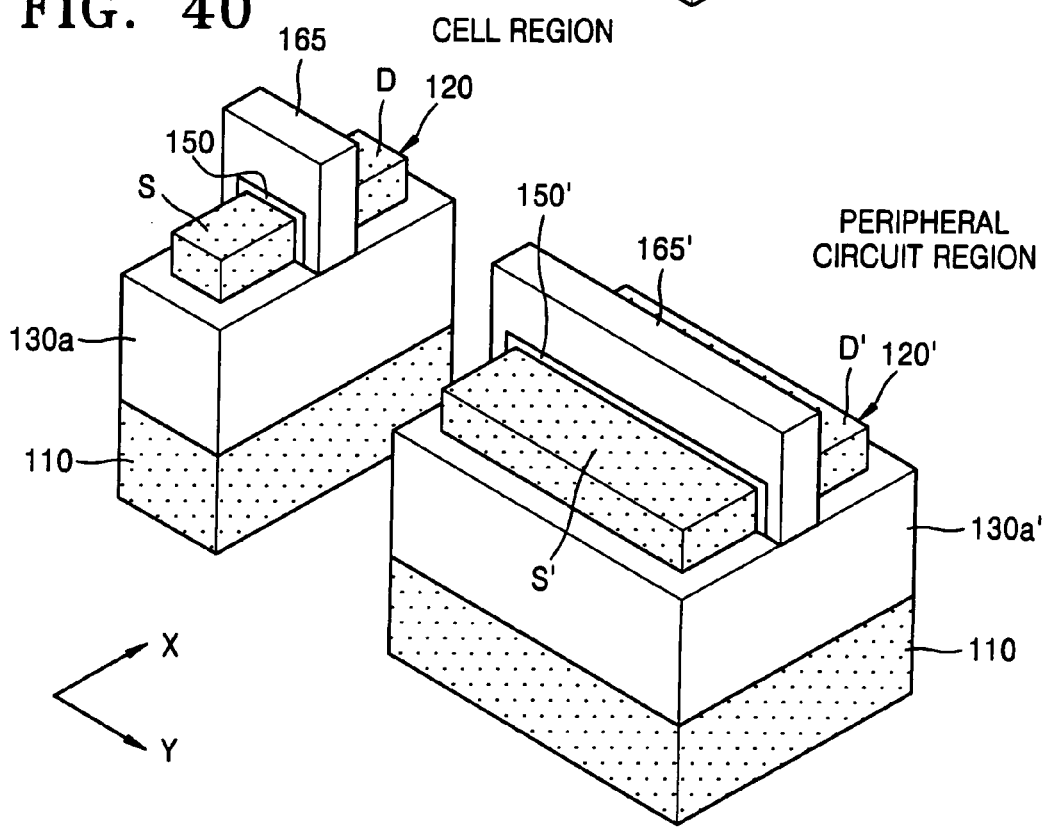
Figure 41:
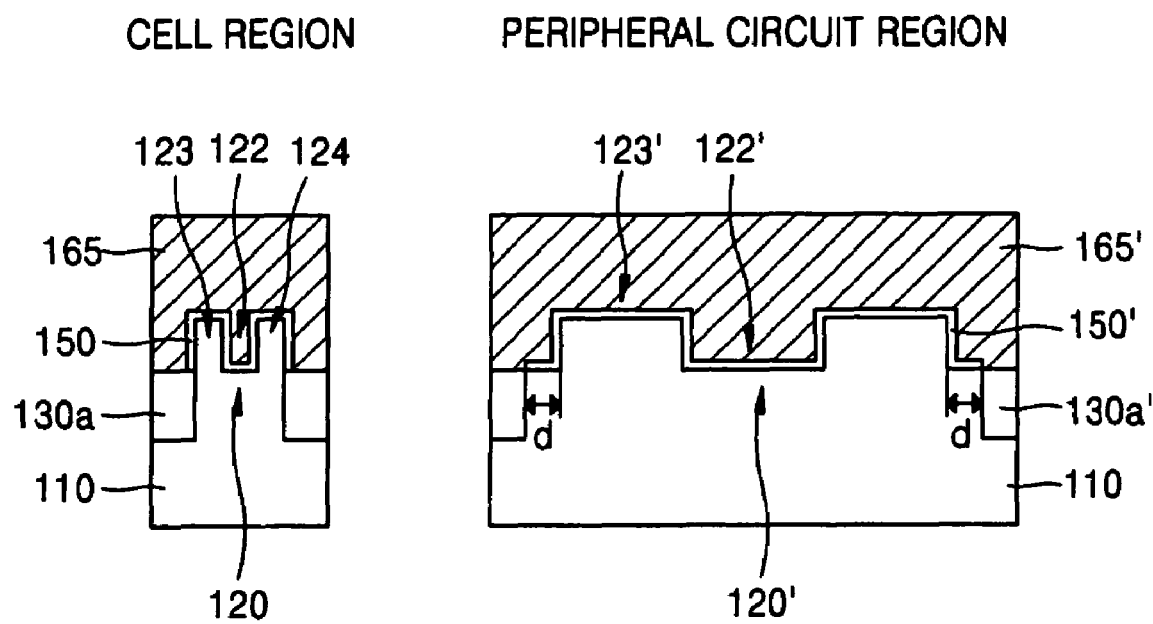
FIG. 41 illustrates a cross-sectional view, taken along the y-direction, of a semiconductor device in accordance with the sixth embodiment of the present invention as shown in FIG. 40.

FIGS. 32 through 40 illustrate perspective views of stages in a method of fabricating a semiconductor device in accordance with a sixth embodiment of the present invention. FIG. 41 illustrates a cross-sectional view, taken along the y-direction, of a semiconductor device in accordance with the sixth embodiment of the present invention as shown in FIG. 40.

In a semiconductor device according to the sixth embodiment of the present invention, while a plurality of single channel FinFETs is formed in the peripheral circuit region, just as in the fifth embodiment, the single channel FinFETs in the peripheral circuit region are spaced a predetermined distance away from the surrounding isolation region in the sixth embodiment.

In the method of the sixth embodiment, operations described in connection with the cell region of the fifth embodiment are the same.

Figure 32:
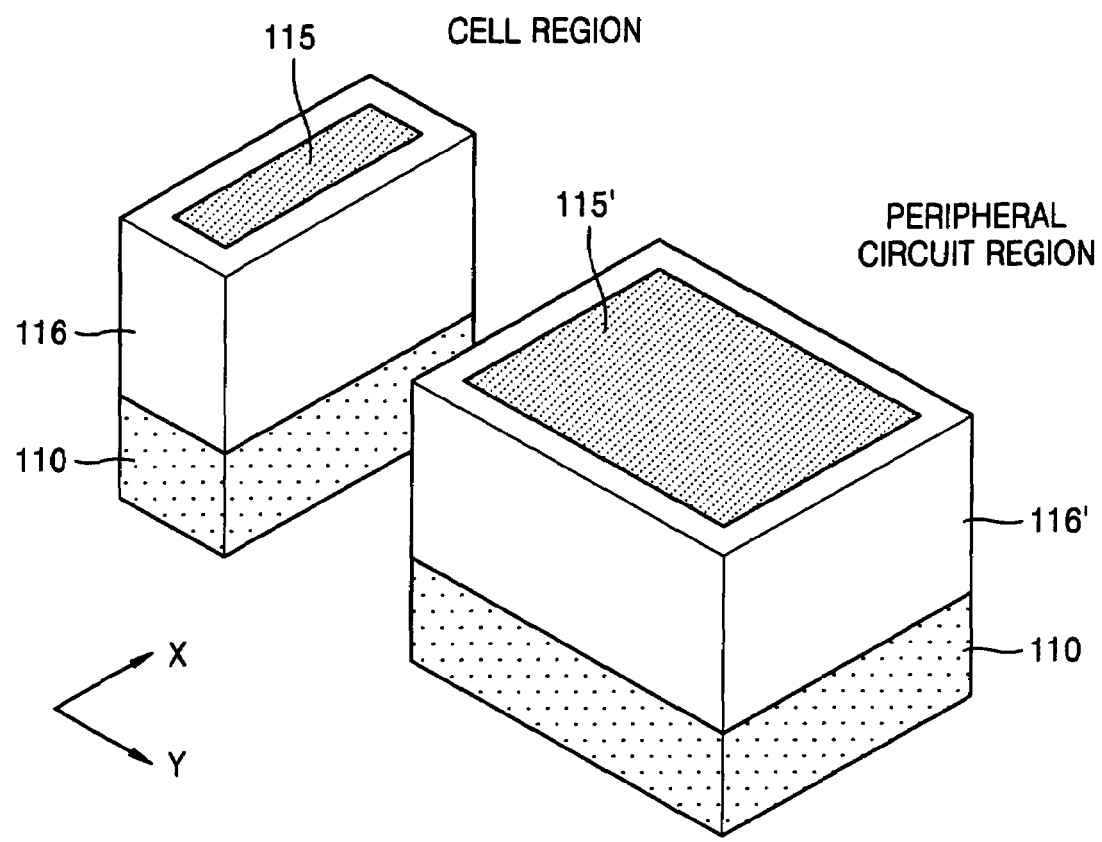
FIGS. 32 through 40 illustrate perspective views of stages in a method of fabricating a semiconductor device in accordance with a sixth embodiment of the present invention.

Referring to FIG. 32, hard masks layers 115 and 115' are deposited on a semiconductor substrate 110, e.g., a bulk silicon wafer. Prior to depositing the hard mask layers 115 and 115', a buffer layer, e.g., a thermal oxide layer, may be deposited on the semiconductor substrate to reduce stress between the hard mask layers 115 and 115' and the substrate 110.

The hard mask layers 115 and 115' are then patterned to define active regions 120 and 120' in the cell region and the peripheral circuit region, respectively, of the semiconductor substrate 110. Subsequently, an insulating material is deposited to surround the active regions 120 and 120' and planarized, e.g., using CMP, until upper surfaces of the hard mask layers 115 and 115' are exposed, thereby forming a primary isolation region 116 and 116'. The primary isolation region 116 and 116' covers sidewalls of the hard mask layers 115 and 115'. When the primary isolation region 116 and 116' is formed on a lower level than the hard mask layers 115 and 115', i.e., by continuing the planarization process longer than a predetermined time, spacers are formed on the sidewalls of the hard mask layers 115 and 115 to prevent exposure of the sidewalls of the hard mask layers 115 and 115'.

Figure 33:
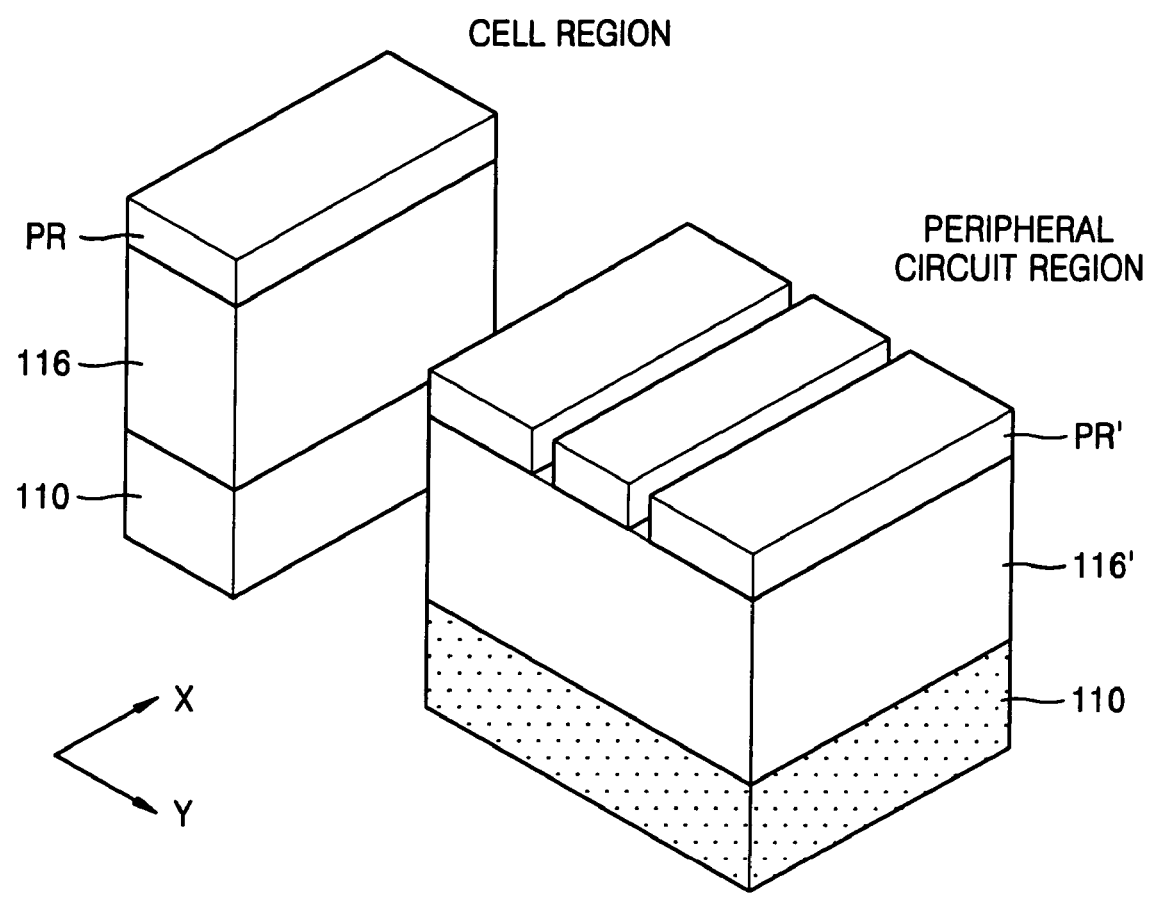

Referring to FIG. 33, the active region photo option mask PR and PR' is formed on hard mask layers 115 and 115' and the primary isolation region 116 and 116' in the cell region and the peripheral circuit region, respectively. While the photo option mask PR covers and protects the entire cell region, the photo option mask PR' is formed as a line-and-space-type on the active region 120' of the peripheral circuit region. In particular, the line-and-space-type photo option mask PR' formed on the active region 120' of the peripheral circuit region is designed to sufficiently cover the hard mask layer 115' and a portion of the primary isolation region 116' adjacent to the hard mask layer 115'.

Figure 34:
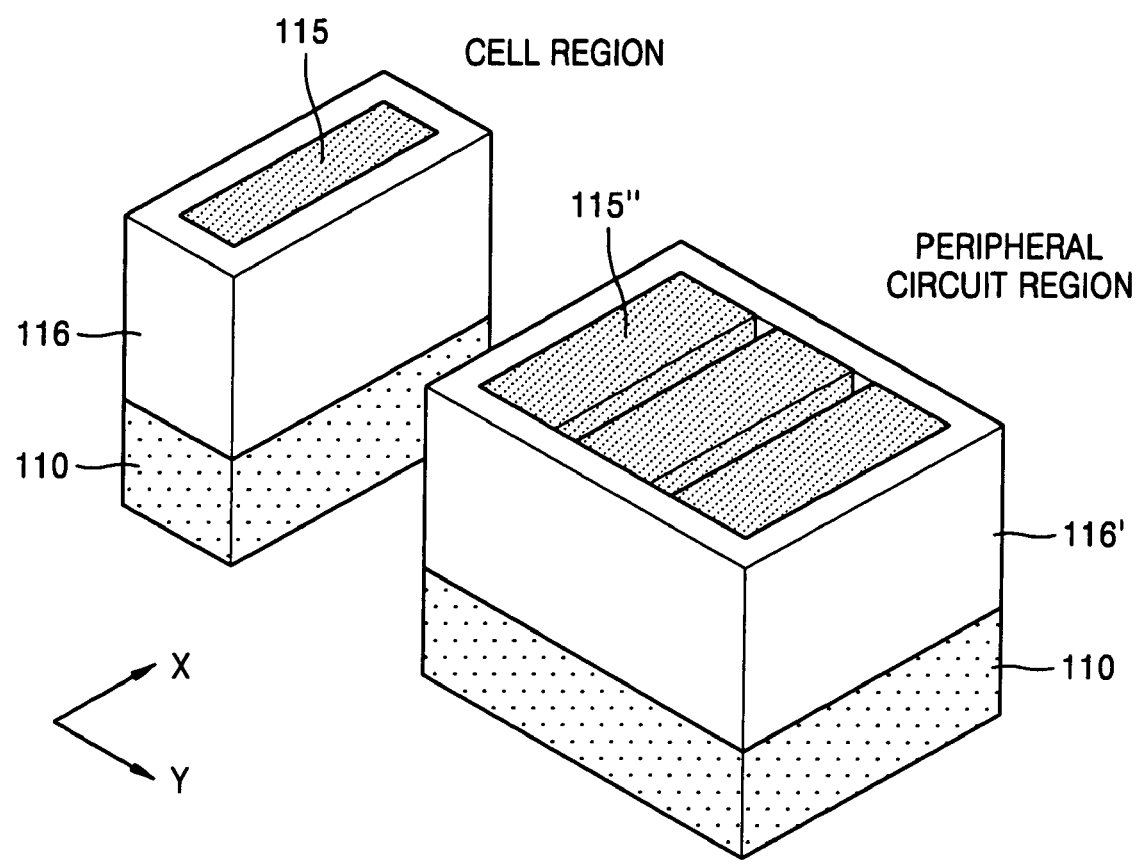

Referring to FIG. 34, the hard mask layer 115' of the peripheral circuit region is anisotropically etched using the photo option mask PR' as an etch mask, thereby forming a line-and-space-type hard mask pattern 115" in the peripheral circuit region. Then, the active region photo option mask PR and PR' is removed.

Figure 35:
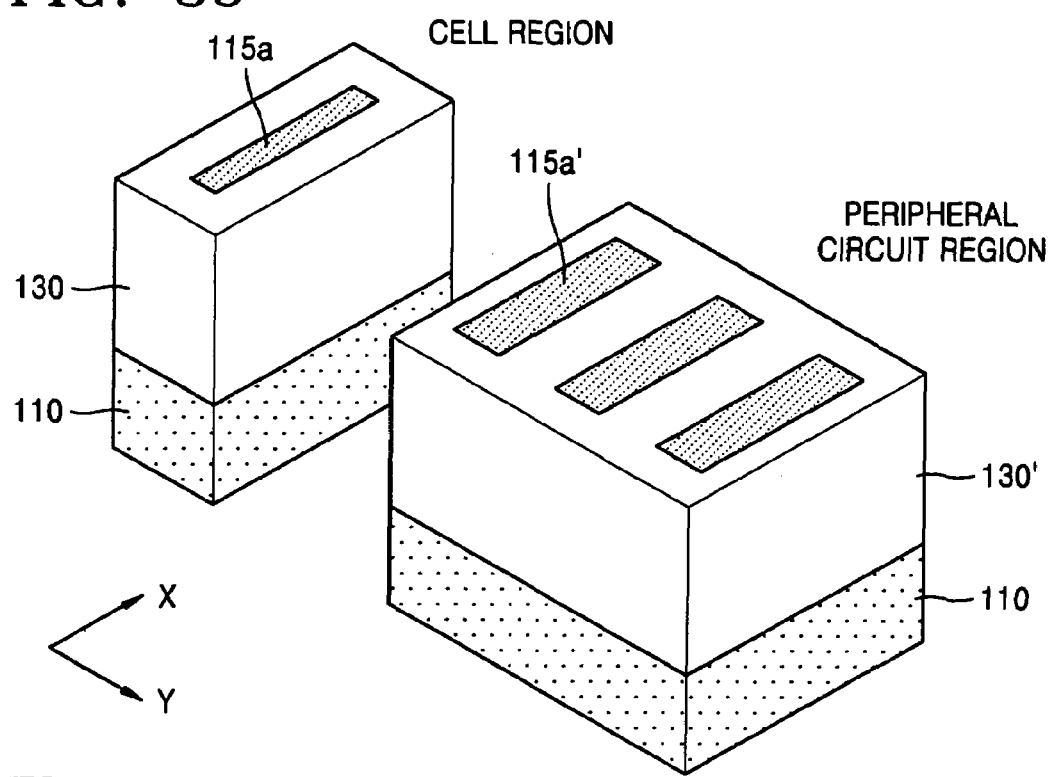

Referring to FIG. 35, the hard mask layer 115 and the line-and-space-type hard mask pattern 115" are isotropically etched to form narrowed hard mask patterns 115a and 115a', i.e., smaller in both the x- and y-directions than the hard masks layer 115 and the line-and-space-type hard mask pattern 115". As opposed to the device of the fifth embodiment, marginal portions of the line-and-space-type hard mask pattern 115", which are adjacent to and contact the primary isolation region 116', are not etched.

Thereafter, a first dielectric layer 130 and 130', e.g., an insulating material such as an oxide, is deposited to cover the hard mask patterns 115a and 115a' and to surround the active regions 120 and 120'. The first dielectric layer 130 and 130' is then planarized, e.g., using CMP, until an upper surface of the hard mask patterns 115a and 115a' is exposed. Hereinafter, the primary isolation region 116 and 116' formed in the operation described in connection with FIG. 32 and the first dielectric layer 130 and 130' will be illustrated and referred to as a gap filling dielectric layer 130 and 130'.

Thereafter, subsequent processes are performed in a similar manner to the fifth embodiment.

Figure 36:
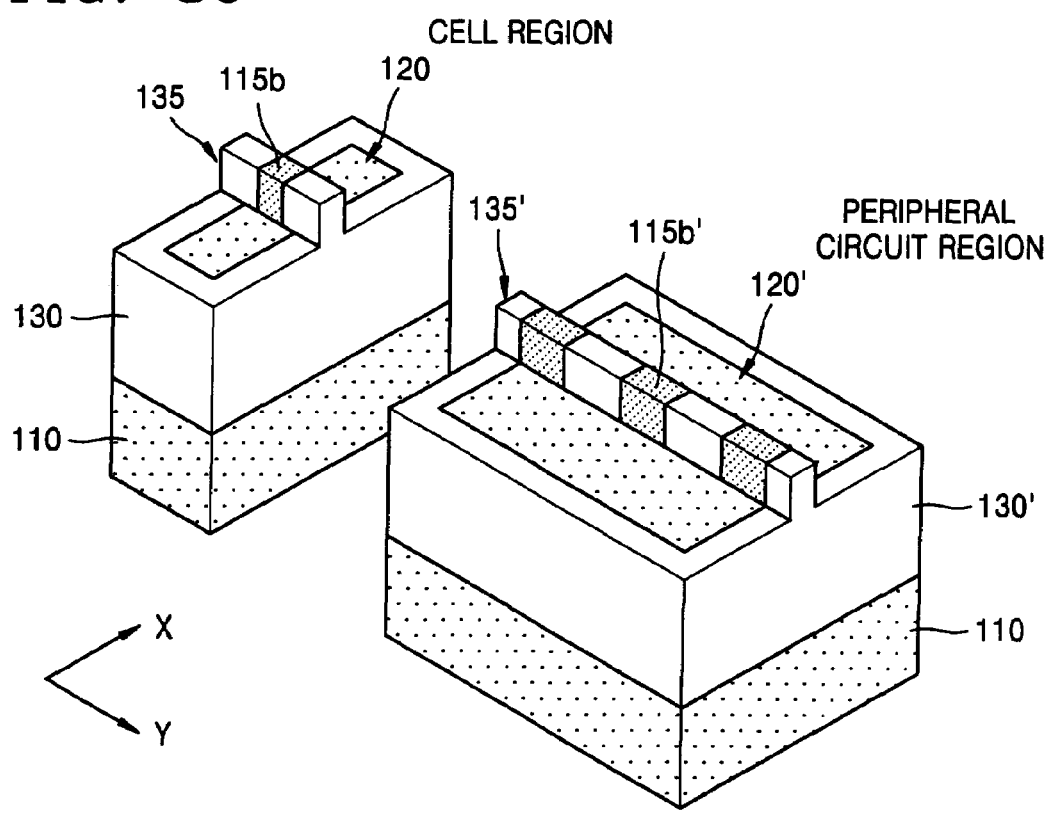

Referring to FIG. 36, the gap filling dielectric layer 130 and 130' and the hard mask patterns 115a and 115a' are patterned to form dummy gate patterns 135 and 135' in the cell region and the peripheral circuit region, respectively. The dummy gate patterns 135 and 135' are formed where gate electrodes 165 and 165' of FIG. 20 will be subsequently formed, i.e., to extend in the y-direction.

During the formation of the dummy gate patterns 135 and 135', most of the hard mask patterns 115a and 115a' are removed. Resultantly, a single channel region defining pattern 115b is formed in a center of the cell region and a plurality of channel region defining regions 115b' is formed in the peripheral circuit region. The plurality of channel region defining patterns 115b' extends in the y-direction through a center of the peripheral circuit region. Portions of an upper surface of the active regions 120 and 120', which are disposed under the dummy gate patterns 135 and 135', respectively, are exposed by the formation of the dummy gate patterns 135 and 135'.

Figure 37:
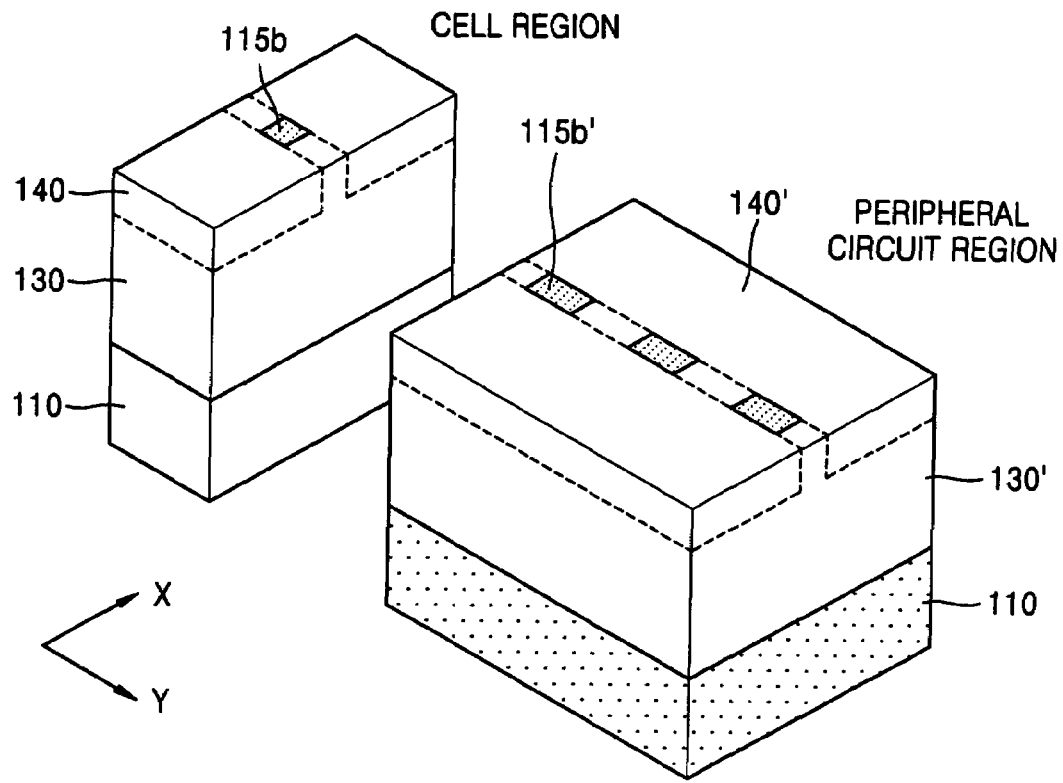

Referring to FIG. 37, a second dielectric layer 140 and 140', e.g., an oxide layer, is deposited on the dummy gate patterns 135 and 135'. The second dielectric layer 140 and 140' is then planarized until an upper surface of the channel region defining patterns 115b and 115b' is exposed. Because the second dielectric layer 140 and 140' and the gap filling dielectric layer 130 and 130' may be similar or identical oxide layers, there may not be an distinct interface therebetween. In any event, the second dielectric layer 140 and 140' and the gap filling dielectric layer 130 and 130' are shown as distinct layers using dotted lines in the figures.

Referring to FIG. 38, the channel region defining patterns 115b and 115b', which were exposed by the planarization process as described in connection with FIG. 37, are selectively removed using wet or dry etching with respect to the second dielectric layer 140 and 140', the gap filling oxide layer 130 and 130', and the substrate 110. Resultantly, openings 145 and 145' are formed where the channel region defining regions 115b and 115b' are removed, and upper surfaces of the active regions 120 and 120' under the openings 145 and 145' are exposed. The active regions 120 and 120' under the openings 145 and 145' are then anisotropically etched using the second dielectric layer 140 and 140' and the gap filling dielectric layer 130 and 130' as an etch mask to define portions to be used as fin channels.

As described above, the width of the fin in the cell region is the difference between the width of the active region 120 and the width of the hard mask pattern 115a. The width of the fin in the peripheral circuit region is the similarly defined. Thus, the widths of the fins, i.e., the active channels, vary with the time taken to perform the isotropic etching as described with reference to FIG. 35.

As in the foregoing embodiments, a channel ion implantation process may be performed on the exposed active regions 120 and 120'. Preferably, several channel ion implantation processes may be performed at different energies such that channel ions are uniformly distributed in fin channels. For example, a first boron implantation may be performed at 30 keV, and then a second boron implantation may be performed at 15 keV. The ion implantation processes may be performed perpendicularly to the substrate 110.

Referring to FIG. 39, the second dielectric layer 140 and 140' and the gap filling oxide layer 130 and 130' are recessed using an anisotropic etching to a same depth as a channel depth. Resultantly, a secondary isolation region 130a and 130a' is formed around the exposed active regions 120 and 120'. In addition, central trenches 122 and 122' are formed in the fin channels of the active regions 120 and 120', respectively, by etching the active regions 120 and 120' through the openings 145 and 145' as described in connection with FIG. 38.

As a result, first protrusion 123 and second protrusion 124, and first protrusions 123', which are comprised of the surface of the substrate 110, in the active regions 120 and 120', respectively, are exposed between the central trenches 122 and 122' and the secondary isolation region 130a and 130a'. Top surfaces and lateral surfaces of the first protrusions 123 and 123' and the second protrusion 124' form three-dimensional active channel regions. In the cell region, the first protrusion 123 and the second protrusion 124 are separated from each other by the central trench 122. In the peripheral circuit region, each of the plurality of first protrusions 123' are separated by one of the central trenches 122'. In the cell region, the first protrusion 123 and the second protrusion 124 may be parallel. In the peripheral circuit region, each of the first protrusions 123' may be parallel to one another. In addition, the first protrusions 123 and 123' and second protrusions 124 and 124' may have a width of about 30 nm or less. Thus, a multi-channel FinFET is formed in the cell region and a plurality of single channel FinFETs is formed in the peripheral circuit region. The plurality of single channel FinFETs in the peripheral circuit region extend in the y-direction.

With particular regard to the sixth embodiment of the present invention, because the marginal portions of the active region hard mask pattern 115', which are adjacent to and contact the primary isolation region 116', are not etched as described with reference to FIG. 35, a protrusion is not formed at an edge portion E, as in the fifth embodiment. At this stage, as in the foregoing embodiments, channel ion implantation processes may be obliquely performed on the substrate 110.

Referring to FIG. 40, a gate dielectric layer 150 and 150', e.g., a gate oxide layer, is formed on the active regions 120 and 120' and the secondary isolation region 130a and 130a'. A gate conductive layer (not shown) is then formed on the gate dielectric layer 150 and 150' and patterned to form gate electrodes 165 and 165' in the cell region and the peripheral circuit region, respectively. Subsequently, impurity ions are implanted to form source and drain regions and are thermally treated. Thus, a source S and a drain D are formed in the active region 120 on either side of the gate electrode 165 in the cell region, and a source S' and a drain D' are formed in the active region 120' on either side of the gate electrode 165' in the peripheral circuit region.

FIG. 41 illustrates a cross-sectional view, taken along the y-direction, of a semiconductor device according to the sixth embodiment of the present invention as shown in FIG. 40.

Referring now to FIG. 41, a multi-channel FinFET is formed in the active region of the cell region, as in the first or fifth embodiments, for example, while a plurality of single channel FinFETs is formed in the peripheral circuit region. In the sixth embodiment of the present invention, the single channel FinFETs in the peripheral circuit region do not contact the isolation region 130a' and an edge of the active region 120', but rather, are separated from the isolation region 130a' by a predetermined distance d, thereby further providing for uniform widths of all of the protrusions formed in the peripheral circuit region. More specifically, an exterior sidewall of an outer peripheral circuit region active channel is spaced apart from the surrounding isolation region by a predetermined distance.

FIG. 42 is a table showing results of a comparison of channel lengths of a semiconductor device including a conventional planar metal-oxide-semiconductor field effect transistor (MOSFET) and a semiconductor device including FinFETs according to the embodiments of the present invention.

When it is assumed that a reference channel length of a planar MOSFET of a cell region is 100 nm and a fin height of a single channel FinFET or a multi-channel FinFET is 100 nm, in the FinFET according to the third embodiment (refer to FIG. 15), effective channel length is 300 nm. In the multi-channel FinFETs according to the first, fourth, fifth, and sixth embodiments (refer to FIGS. 10, 19, 31, and 41, respectively), effective channel length is 500 nm.

When it is assumed that a reference channel length of a planar MOSFET of a peripheral circuit region is 500 nm and a fin height of a single channel FinFET or a multi-channel FinFET is 100 nm, in the multi FinFET according to the fifth embodiment (refer to FIG. 31), effective channel length is 1300 nm. In the plurality of single channels FinFETs according to the sixth embodiment (refer to FIG. 41), effective channel length is 900 nm.

Further, in the multi-channel FinFETs according to the first and second embodiments (refer to FIGS. 10 and 15, respectively), effective channel length is 1500 nm.

A semiconductor device including a multi-channel FinFET and method of fabricating the same produces the following advantages. First, because three-dimensional channels are obtained by forming central trenches in active regions in the present invention, reductions in contact areas of sources and drains may be prevented. More specifically, three-dimensional channel regions can be formed without reducing the area of active regions defined when isolation regions are formed.

Second, in the present invention, active region hard masks are isotropically etched and used as channel region defining patterns. Accordingly, the entire process can be simplified by omitting a process of coating or depositing an additional material required for forming channel region defining patterns, and, thus, fabrication cost can be reduced.

Third, fins having a uniform width can be formed by changing an edge shape of an active region of a conventional FinFET without changing the conventional layout. Therefore, a current characteristic requisite for a transistor can be stably maintained.

Fourth, as compared with when an SOI substrate is used, the semiconductor device of the present invention, which may use a bulk silicon substrate, reduces fabrication cost and avoids a floating body effect, a drop in breakdown voltage between a source and a drain, and an increase in off-current.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a semiconductor substrate having a cell region and a peripheral circuit region, a portion of the semiconductor substrate in the cell region and in the peripheral circuit region including an isolation region defining an active region;
   portions of the active region protruding above an upper surface of the isolation region to define at least two active channels, respectively;
   a gate dielectric layer over the active region of the semiconductor substrate including the at least two protruding active channels;
   a gate electrode over the at least two protruding active channels, the gate dielectric layer and the isolation region of the semiconductor substrate, the gate electrode at least partially filling a trench located between a given pair of the at least two protruding active channels, the trench laterally overlapping the active region; and
   a source/drain region in the active region of the semiconductor substrate on either side of the gate electrode.

2. The semiconductor device as claimed in claim 1, wherein the semiconductor substrate is selected from the group consisting of a bulk silicon wafer, a silicon-on-insulator (SOI) substrate, a silicon germanium-on-insulator (SGOI) substrate, and a silicon germanium (SiGe) wafer.

3. The semiconductor device as claimed in claim 1, wherein the at least two active channels are parallel.

4. The semiconductor device as claimed in claim 1, wherein each of the at least two protruding active channels has a width of about 30 nm or less.

5. The semiconductor device as claimed in claim 1, wherein an upper surface of the active region between the at least two protruding active channels is level with the upper surface of the isolation region in the semiconductor substrate.

6. The semiconductor device as claimed in claim 1, wherein the active region between the at least two protruding active channels is recessed so that an upper surface of the active region between the at least two protruding active channels is lower than the upper surface of the isolation region in the semiconductor substrate.

7. The semiconductor device as claimed in claim 1, wherein an upper surface of the active region between the at least two protruding active channels is higher than the upper surface of the isolation region in the semiconductor substrate.

8. The semiconductor device as claimed in claim 1, wherein the at least two protruding active channels are cell region active channels formed in the cell region of the semiconductor substrate.

9. The semiconductor device as claimed in claim 8, further comprising:
   a portion of the active region in the peripheral circuit region of the semiconductor substrate protruding above the upper surface of the isolation region in the peripheral circuit region of the semiconductor substrate to define a plurality of peripheral circuit region active channels.

10. The semiconductor device as claimed in claim 1, further comprising:
    a portion of the active region in the peripheral circuit region of the semiconductor substrate protruding above the upper surface of the isolation region in the peripheral circuit region of the semiconductor substrate to define a plurality of peripheral circuit region active channels.

11. The semiconductor device as claimed in claim 10, wherein the active region under each of the plurality of peripheral circuit region active channels is separated by the isolation region.

12. The semiconductor device as claimed in claim 1, wherein the at least two protruding active channels are peripheral circuit region active channels formed in the peripheral circuit region of the semiconductor substrate.

13. The semiconductor device as claimed in claim 12, wherein the active region under each of the plurality of peripheral circuit region active channels is separated by the isolation region.

14. The semiconductor device as claimed in claim 12, further comprising:

a portion of the active region in the cell region of the semiconductor substrate protruding above the upper surface of the isolation region in the cell region of the semiconductor substrate to define a cell region active channel.

15. The semiconductor device as claimed in claim 1, wherein a first portion of the at least two protruding active channels are cell region active channels formed in the cell region of the semiconductor substrate and a second portion of the at least two protruding active channels are peripheral circuit region active channels formed in the peripheral circuit region of the semiconductor substrate.

16. The semiconductor device as claimed in claim 1, further comprising:
a portion of the active region in the cell region of the semiconductor substrate protruding above the upper surface of the isolation region in the cell region of the semiconductor substrate to define a cell region active channel.

17. The semiconductor device as claimed in claim 1, wherein the at least two protruding active channels are cell region active channels formed in the cell region of the semiconductor substrate and further comprising a portion of the active region in the peripheral portion of the semiconductor substrate protruding above the upper surface of the isolation region in the peripheral circuit region of the semiconductor substrate to define a plurality of peripheral circuit region active channels formed in the peripheral circuit region of the semiconductor substrate.

18. The semiconductor device as claimed in claim 17, wherein at least two of the plurality of peripheral circuit region active channels that protrude above the upper surface of the isolation region in the peripheral circuit region of the semiconductor substrate are adjacent to the isolation region.

19. The semiconductor device as claimed in claim 17, wherein the plurality of peripheral circuit region active channels that protrude above the upper surface of the isolation region in the peripheral circuit region of the semiconductor substrate are separated from the isolation region by a predetermined distance.

20. The semiconductor device as claimed in claim 1, wherein the isolation region surrounds lateral sides of the active region, the lateral sides of the active region extending along a direction substantially perpendicular to a plane along which the semiconductor substrate extends.

21. The semiconductor device as claimed in claim 1, wherein:
the given pair is a given first pair; and
the gate electrode at least partially fills an opening located between a given second pair of the at least two protruding active channels,
the opening differing significantly in lateral size relative to the trench, and the opening laterally overlapping the isolation region.

* * * * *